US012713784B2

(12) United States Patent
Lee et al.

(10) Patent No.: US 12,713,784 B2
(45) Date of Patent: Aug. 18, 2026

(54) DISPLAY DEVICE

(71) Applicant: Samsung Display Co., Ltd., Yongin-si (KR)

(72) Inventors: Kang Young Lee, Seongnam-si (KR); Dong Chul Shin, Hwaseong-si (KR); Hyun Sup Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 541 days.

(21) Appl. No.: 17/540,026

(22) Filed: Dec. 1, 2021

(65) Prior Publication Data

US 2022/0181413 A1 Jun. 9, 2022

(30) Foreign Application Priority Data

Dec. 4, 2020 (KR) ........................ 10-2020-0168151

(51) Int. Cl.

| | |
|---|---|
| ***H10K 59/124*** | (2023.01) |
| ***H10K 59/12*** | (2023.01) |
| ***H10K 59/122*** | (2023.01) |
| ***H10K 59/35*** | (2023.01) |
| ***H10K 59/80*** | (2023.01) |

(52) U.S. Cl.

CPC ......... *H10K 59/124* (2023.02); *H10K 59/122* (2023.02); *H10K 59/353* (2023.02); *H10K 59/873* (2023.02); *H10K 59/12* (2023.02)

(58) Field of Classification Search

CPC ............. H10K 50/8426; H10K 59/122; H10K 50/844; H10K 59/873

See application file for complete search history.

(56) References Cited

U.S. PATENT DOCUMENTS

| | | | | |
|---|---|---|---|---|
| 10,347,866 | B1 * | 7/2019 | Kim | H10K 59/8731 |
| 10,446,793 | B2 | 10/2019 | Kim et al. | |
| 10,454,063 | B2 | 10/2019 | Chang et al. | |
| 10,608,071 | B2 | 3/2020 | Hong et al. | |
| 10,692,958 | B2 | 6/2020 | Lee et al. | |
| 10,862,071 | B2 | 12/2020 | Chang et al. | |
| 10,944,074 | B2 | 3/2021 | Kishimoto et al. | |
| 11,355,728 | B2 | 6/2022 | Kim et al. | |

(Continued)

FOREIGN PATENT DOCUMENTS

| | | | |
|---|---|---|---|
| CN | 107919293 | A | 4/2018 |
| CN | 109887953 | A | 6/2019 |

(Continued)

OTHER PUBLICATIONS

Office Action, corresponding to Chinese Application No. 202111420176.9, dated Jun. 2, 2026, 8 pages.

*Primary Examiner* — Brian Turner

(74) *Attorney, Agent, or Firm* — Womble Bond Dickinson (US) LLP

(57) ABSTRACT

A display device includes: a substrate; a first pixel on the substrate; a dam structure on the substrate and surrounding the first pixel in a plan view; a spacer in an area surrounded by the dam structure in the plan view; a first inorganic encapsulation layer on the dam structure and the spacer; and an organic encapsulation layer on the first inorganic encapsulation layer, wherein an upper surface of the spacer is at a higher position than an upper surface of the dam structure and an upper surface of the organic encapsulation layer.

13 Claims, 16 Drawing Sheets

(56) References Cited

U.S. PATENT DOCUMENTS

| | | | | |
|---|---|---|---|---|
| 11,411,202 | B2 | 8/2022 | Chang et al. | |
| 11,430,851 | B2 | 8/2022 | Hong et al. | |
| 2016/0307971 | A1* | 10/2016 | Jeon | H10K 59/00 |
| 2017/0069873 | A1* | 3/2017 | Kim | H10K 59/88 |
| 2017/0148856 | A1* | 5/2017 | Choi | H10K 59/124 |
| 2017/0279057 | A1* | 9/2017 | Park | H10K 50/8426 |
| 2018/0102502 | A1* | 4/2018 | Kim | H01L 22/12 |
| 2018/0124933 | A1* | 5/2018 | Park | H05K 13/04 |
| 2019/0196630 | A1* | 6/2019 | Lai | G06F 3/0443 |
| 2019/0280065 | A1 | 9/2019 | Kim et al. | |
| 2019/0296097 | A1* | 9/2019 | Hong | H10K 59/352 |
| 2020/0168823 | A1* | 5/2020 | Kim | H10K 59/122 |
| 2020/0176520 | A1 | 6/2020 | Kim et al. | |
| 2020/0194508 | A1* | 6/2020 | Gwon | H10K 71/00 |
| 2021/0303816 | A1* | 9/2021 | Sun | H10K 59/124 |
| 2021/0343825 | A1 | 11/2021 | Hong et al. | |
| 2022/0045300 | A1* | 2/2022 | He | H10K 59/1216 |
| 2022/0399412 | A1* | 12/2022 | Yu | H10K 59/122 |
| 2022/0416002 | A1 | 12/2022 | Hong et al. | |

FOREIGN PATENT DOCUMENTS

| | | | |
|---|---|---|---|
| CN | 110556411 | A | 12/2019 |
| CN | 111512702 | A | 8/2020 |
| CN | 111554714 | A | 8/2020 |
| KR | 1020160081106 | A | 7/2016 |
| KR | 1020170080306 | A | 7/2017 |
| KR | 2018-0039801 | A | 4/2018 |
| KR | 20190082362 | A | 7/2019 |
| KR | 2019-0112880 | A | 10/2019 |
| KR | 2020-0067576 | A | 6/2020 |

* cited by examiner

TFE: TFE1, TFE2, TFE3
SDL: SDL1, SDL2, SDL3

DISPLAY DEVICE

CROSS-REFERENCE TO RELATED APPLICATION

The present application claims priority to and the benefit of Korean Patent Application No. 10-2020-0168151 filed on Dec. 4, 2020 in the Korean Intellectual Property Office, the entire content of which is incorporated herein by reference.

BACKGROUND

1. Field

Aspects of some embodiments of the present disclosure relate to a display device.

2. Description of the Related Art

As the information-oriented society evolves, various demands for display devices are ever increasing. For example, display devices are being incorporated into a variety of electronic devices such as smart phones, digital cameras, laptop computers, navigation devices, and smart televisions. Display devices have become more and more important as multimedia technology evolves. Accordingly, a variety of types of display devices such as liquid-crystal display (LCD) devices and organic light-emitting display (OLED) devices are currently used.

Among display devices, self-luminous display devices include a self-luminous element, e.g., an organic light-emitting element. A self-luminous element may include two opposing electrodes and an emissive layer interposed therebetween. For an organic light-emitting element as a self-luminous element, electrons and holes supplied from the two electrodes are recombined in the emissive layer to generate excitons, the generated excitons relax from the excited state to the ground state and accordingly light can be emitted.

Such a self-luminous display device may not utilize a separate light source, and thus it may consume relatively less power and may be made relatively light and thin, as well as exhibit relatively high-quality characteristics such as a relatively wide viewing angle, relatively high luminance and contrast, and relatively fast response speed. Accordingly, organic light-emitting display devices are attracting attention as the next generation display device.

Recently, the demand for flexible display devices is increasing. Among flexible display devices, a stretchable display device that can expand and contract may have a variety of applications. A stretchable display device can be utilized itself, and may also be applied to other flexible display devices, foldable displays, rollable displays, etc. for effective bending, folding, and rolling.

The above information disclosed in this Background section is only for enhancement of understanding of the background and therefore the information discussed in this Background section does not necessarily constitute prior art.

SUMMARY

Aspects of some embodiments of the present disclosure include a display device with relatively improved reliability by way of preventing or reducing damage to a dam structure surrounding a pixel and suppressing, preventing, or reducing permeation of outside air, moisture, and other contaminants due to damage to the dam structure.

It should be noted that characteristics of embodiments according to the present disclosure are not limited to the above-mentioned characteristics; and other characteristics of embodiments according to the present invention will be more apparent to those skilled in the art from the following descriptions.

According to some embodiments of the present disclosure, a display device includes: a substrate, a first pixel on the substrate, a dam structure on the substrate and surrounding the first pixel when viewed from top, a spacer in an area surrounded by the dam structure when viewed from the top, a first inorganic encapsulation layer on the dam structure and the spacer, and an organic encapsulation layer on the first inorganic encapsulation layer, wherein an upper surface of the spacer is located at a higher position than an upper surface of the dam structure and an upper surface of the organic encapsulation layer.

According to some embodiments of the present disclosure, a display device includes: a substrate comprising a plurality of islands separated by slits, and a plurality of bridges connecting between adjacent ones of the islands, a planarization layer on the substrate, a passivation layer on the planarization layer, a pixel electrode on the passivation layer, a pixel-defining layer exposing the pixel electrode and on the pixel electrode, an emissive layer on the pixel electrode, a spacer on the pixel-defining layer, and an encapsulation layer covering the pixel-defining layer and the spacer and comprising an inorganic encapsulation layer and an organic encapsulation layer sequentially stacked on one another, wherein an upper surface of the spacer is located at a higher position than an upper surface of the organic encapsulation layer from one surface or an upper surface of the substrate.

According to some example embodiments of the present disclosure, the reliability of a display device can be improved by way of preventing or reducing damage to a dam structure surrounding a pixel and suppressing, preventing, or reducing permeation of outside air, moisture, and other contaminants due to damage to the dam structure.

It should be noted that characteristics of embodiments according to the present disclosure are not limited to those described above and other characteristics of embodiments according to the present disclosure will be apparent to those skilled in the art from the following descriptions.

BRIEF DESCRIPTION OF THE DRAWINGS

The above and other aspects and characteristics of embodiments according to the present disclosure will become more apparent by describing in more detail aspects of some embodiments thereof with reference to the attached drawings, in which.

DETAILED DESCRIPTION

Aspects of some embodiments of the present invention will now be described more fully hereinafter with reference to the accompanying drawings, in which some example embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, aspects of some example embodiments of the present disclosure will be described in more detail with reference to the accompanying drawings.

Figure 1:
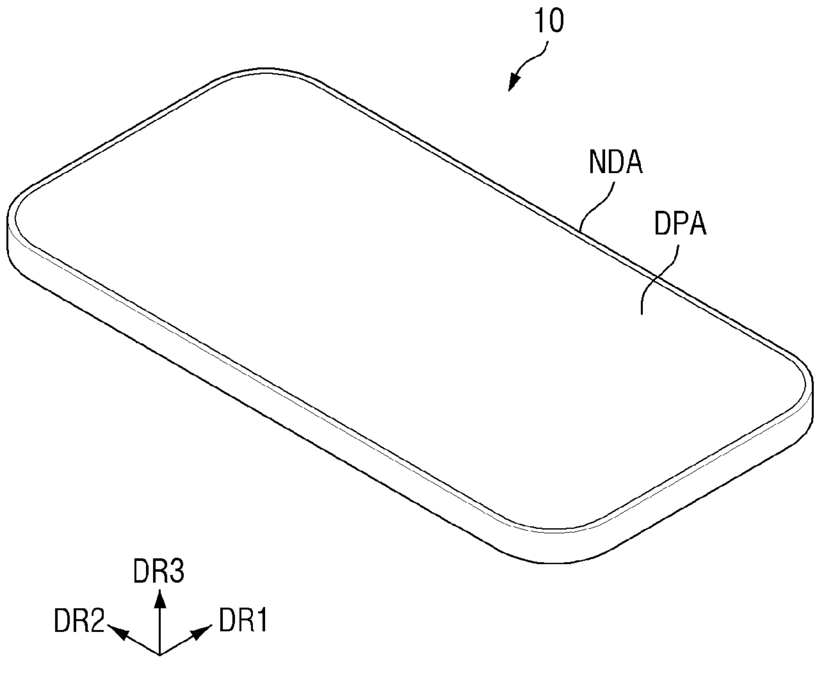
FIG. 1 is a perspective view of a display device according to some embodiments of the present disclosure.

FIG. 1 is a perspective view of a display device according to some embodiments of the present disclosure.

Throughout the specification, a first direction DR1 and a second direction DR2 refer to directions crossing each other. A third direction DR3 may be perpendicular to the plane where the first direction DR1 and the second direction DR2 are located and may refer to the thickness direction. In the drawings, the first direction DR1 represents the horizontal direction, and the second direction DR2 represents the vertical direction when viewed from the top (e.g., when viewed in a direction perpendicular to the plane defined by the first direction DR1 and the second direction DR2, or a direction perpendicular or normal with respect to a plane of the display surface). It is, however, to be understood that embodiments according to the present disclosure are not limited thereto.

Referring to FIG. 1, a display device 10 displays a moving image or a still image and includes a display panel. Examples of the display panel may include a self-luminous display panel such as an organic light-emitting display panel (OLED), an inorganic light-emitting display panel (inorganic LED), a quantum-dot light-emitting display panel (QD-LED), a micro LED display panel (micro-LED), a nano LED display panel (nano-LED), a plasma display panel (PDP), a field emission display panel (FED) and a cathode ray display panel (CRT), as well as a light-receiving display panel such as a liquid-crystal display panel (LCD) and an electrophoretic display panel (EPD)

In the following description, the organic light-emitting display panel will be described as an example of the display panel, and the organic light-emitting display panel will be simply referred to as the display panel 300 unless specifically stated otherwise. It is, however, to be understood that the example embodiments of the present disclosure are not limited to the organic light-emitting display panel, and any other display panel listed above or well known in the art may be employed without departing from the spirit and scope of embodiments according to the present disclosure.

The display device 10 may further include a touch member. The touch member may be either integrated with the display panel or implemented as a panel separate from the display panel.

In addition to the display panel, the display device 10 may further include a sensor, a variety of controllers, a housing, and other elements. Any display device including a display area DPA for displaying images or videos may be employed as the display device 10 regardless of its main purpose, added features or name, etc. Examples of the display device 10 include, but embodiments according to the present disclosure are not limited to, a smart phone, a mobile phone, a tablet PC, a personal digital assistant (PDA), a portable multimedia player (PMP), a television set, a game machine, a wristwatch-type electronic device, a head-mounted display, a personal computer monitor, a laptop computer, a car navigation system, a car instrument cluster, a digital camera, a camcorder, an outdoor billboard, an electronic billboard, various medical apparatuses, various inspection devices, various home appliances including a distance such as a refrigerator and a laundry machine, Internet of things (IoT) devices, etc.

The display device 10 may include the display area DA and a non-display area NDA. The display area DPA may refer to an active area where images are displayed, while the non-display area NDA may refer to an inactive area where no image is displayed. The display area DPA may have, but is not limited to, a rectangular shape when viewed from the top. It may have a variety of shapes such as a square, a rhombus, a circle and an oval.

The non-display area NDA may be arranged or formed around the display area DPA. The non-display area NDA may surround the display area DPA entirely or partially. In the non-display area NDA, signal lines for applying signals to the display area DPA or transferring signals detected in the display area DPA may be located. The non-display area NDA, which is the inactive area, may correspond to the bezel of the display device 10. Although the non-display area NDA is arranged around all sides of the rectangular display area DPA, but embodiments according to the present disclosure are not limited thereto. The non-display area NDA may not be formed on some of the sides. Alternatively, the non-display area NDA may be bent to the rear surface of the display area DPA so that it overlaps with the display area DPA in the thickness direction, and thus the non-display area NDA may look as if it is omitted when viewed from the top.

Figure 4:
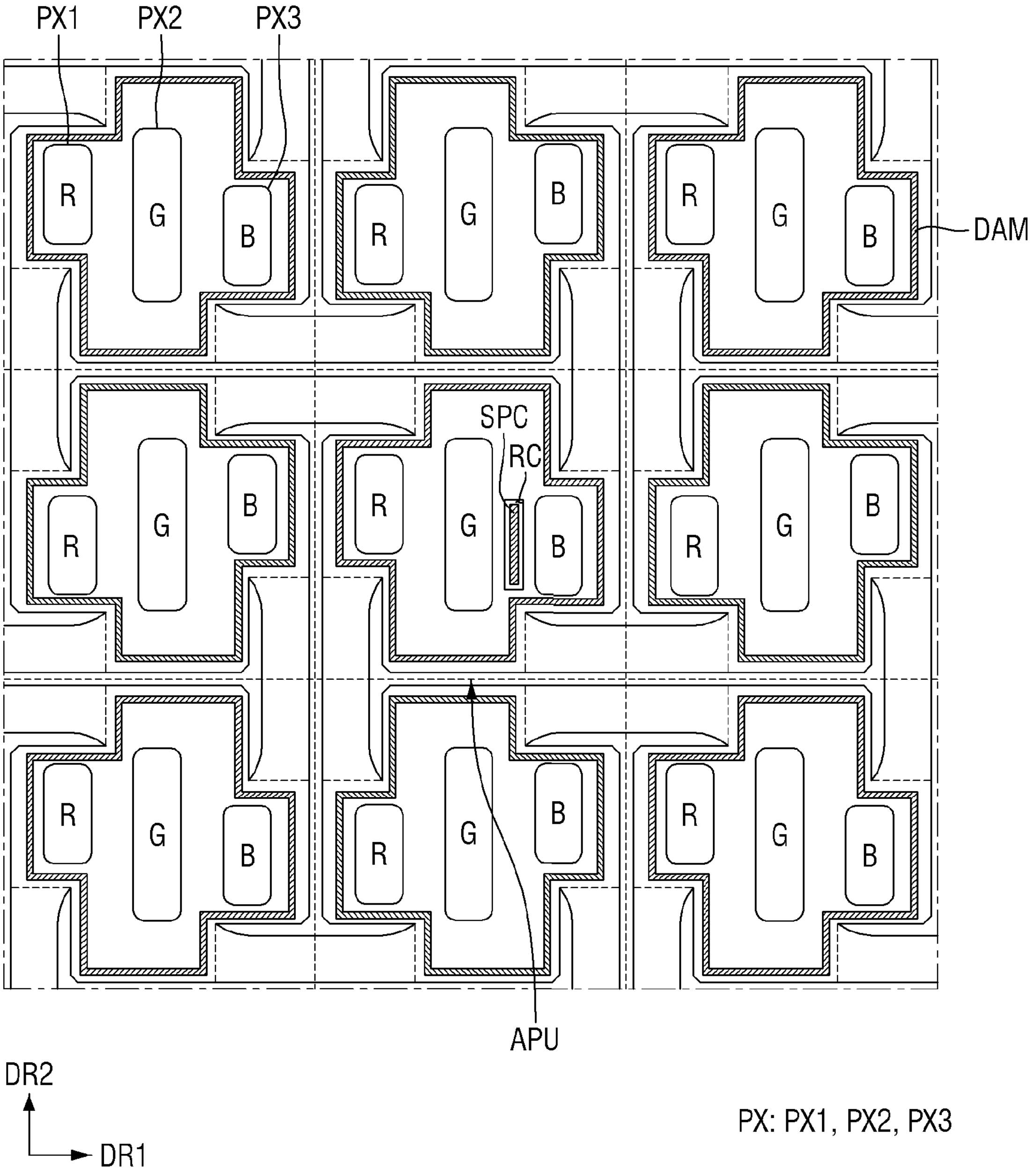
FIG. 4 is a schematic view showing an arrangement of islands on a substrate at a part of a display device according to some embodiments of the present disclosure.

The display area DPA includes a plurality of pixels PX (see FIG. 4). The pixels PX (see FIG. 4) are arranged in a matrix pattern. The pixels PX (see FIG. 4) may include a first color pixel, a second color pixel, and a third color pixel. The first color pixel may be a red pixel, the second color pixel may be a green pixel, and the third color pixel may be a blue pixel. According to some embodiments of the present disclosure, the pixels PX (see FIG. 4) may have a stripe arrangement in which pixels of the same color are arranged in the second direction DR2, which is the column direction, while red, green, and red pixels are arranged in this order repeatedly in the first direction DR1, which is the row direction, as shown in FIG. 4. It is, however, to be understood that the arrangement of the pixels PX is not limited to that shown in FIG. 4. For example, the pixels PX (see FIG. 4) may have a pentile arrangement in which each of the pixels PX (see FIG. 4) is formed in a diamond shape and a red pixel and a blue pixel are radially arranged around a green pixel. In addition, the pixels PX (see FIG. 4) may further include a white pixel in addition to red, green and blue pixels.

The display device 10 may be a flexible device. The display device 10 may be stretched, curved, bent, folded, or rolled. The flexibility of the display device 10 can be achieved by a flexible substrate. The flexible substrate may include a flexible polymer. Examples of the flexible polymer include polyimide or polyester (e.g., polyethylene terephthalate, polybutylene phthalate, polyethylene naphthalate, etc.), polystyrene, polycarbonate, polyether sulfone, polyarylate, polycycloolefin, norbornene resin, poly(chlorotrifluoroethylene), polymethyl methacrylate, etc.

Figure 2:
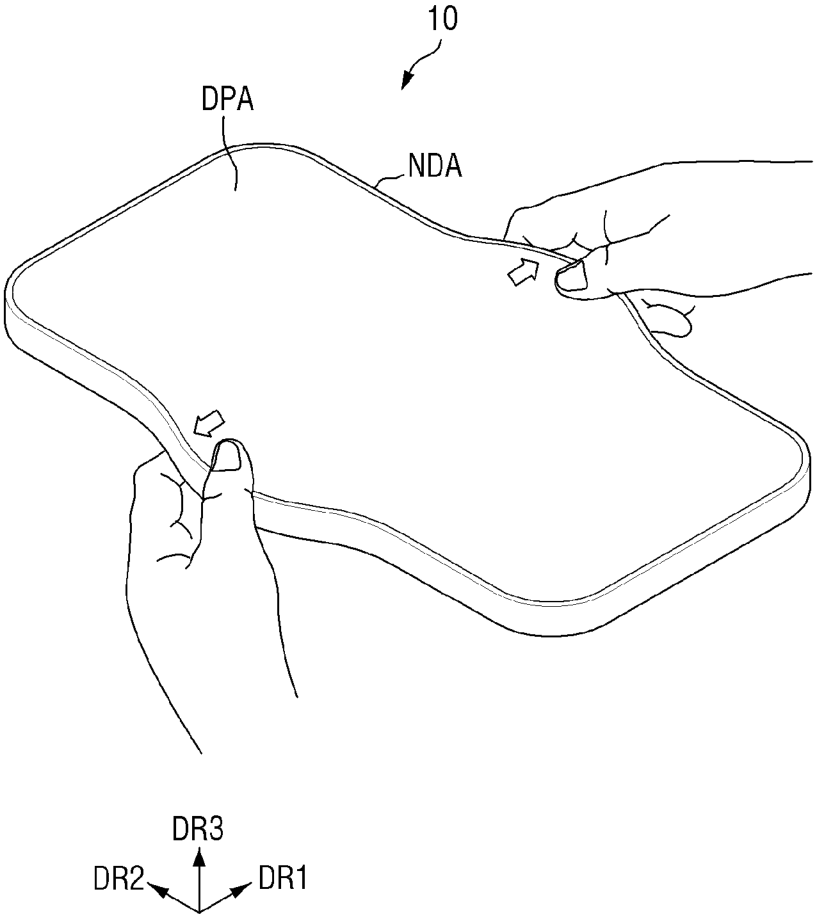
FIG. 2 is a perspective view showing the display device of FIG. 1 when it is stretched in the horizontal direction.
Figure 3:
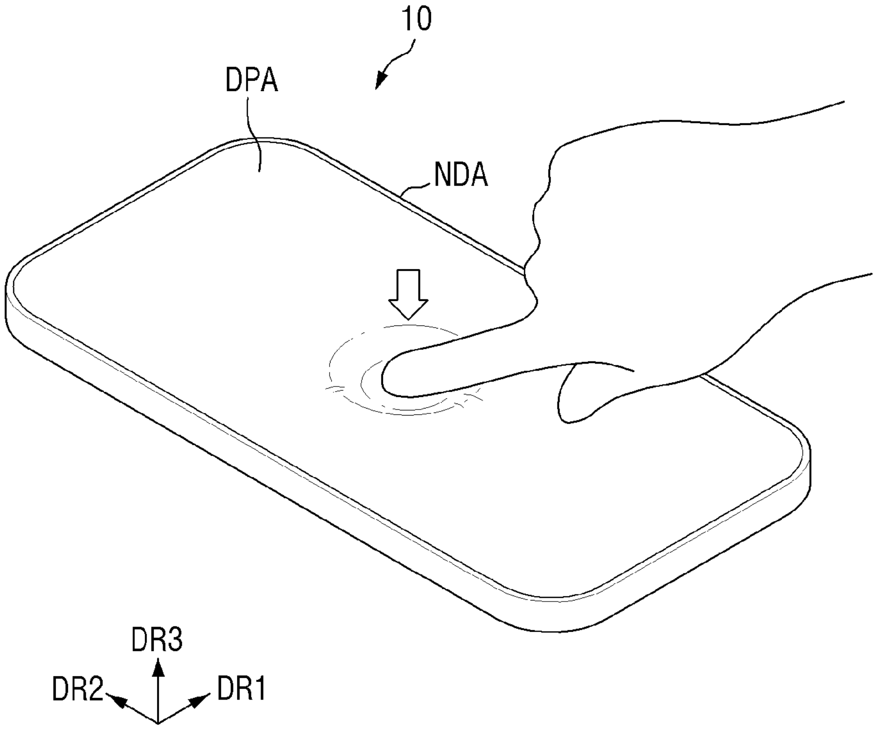
FIG. 3 is a perspective view showing the display device of FIG. 1 when it is partially stretched.

FIGS. 2 and 3 show an application of a stretchable display device as an example of a flexible display device. FIG. 2 is a perspective view showing the display device of FIG. 1 when it is stretched in the horizontal direction. FIG. 3 is a perspective view showing the display device of FIG. 1 when it is partially stretched.

Referring to FIG. 2, the display device 10 may be stretched in the horizontal direction. For example, by grabbing the edges of the display device 10 and extending it on the both sides, the display device 10 may be stretched in that direction. The area of the display device 10 can be increased when viewed from the top as it is stretched. Although the display device 10 is stretched in the first direction DR1 in the drawings, it may be stretched in the second direction DR2, may be stretched in both the second direction DR2 and the first direction DR1, or may be stretched in other horizontal directions. The display device 10 may be stretched by an external force, and it may contract and return to its original state when the external force is removed.

Referring to FIG. 3, the display device 10 may be partially stretched while maintaining the overall area when viewed from the top. For example, as shown in FIG. 3, when a point of the display device 10 is pressed in the third direction DR3, which is the thickness direction, the display device 10 may be partially stretched around the pressed point. In this case, the direction in which the display device 10 is stretched may be oblique to the horizontal direction, and the overall area of the display device 10 can be maintained when viewed from the top. When the pressing force is removed, the stretched part can contract again and return to its original state.

The display device may be stretched as shown in FIGS. 2 and 3 at the same time. For example, while a part of the display device may be stretched in a direction oblique to the horizontal direction as it is pressed in the thickness direction, the overall area may be further increased when viewed from the top.

When the display device 10 is expanded or contracted as described above, the substrate of the display device 10 and thin films formed or arranged thereon are subjected to stress. In order to alleviate such stretching stress, the substrate of the display device 10 may include slits SLT (see FIG. 5). More detailed description thereon will be given with reference to FIGS. 4 and 5.

Figure 5:
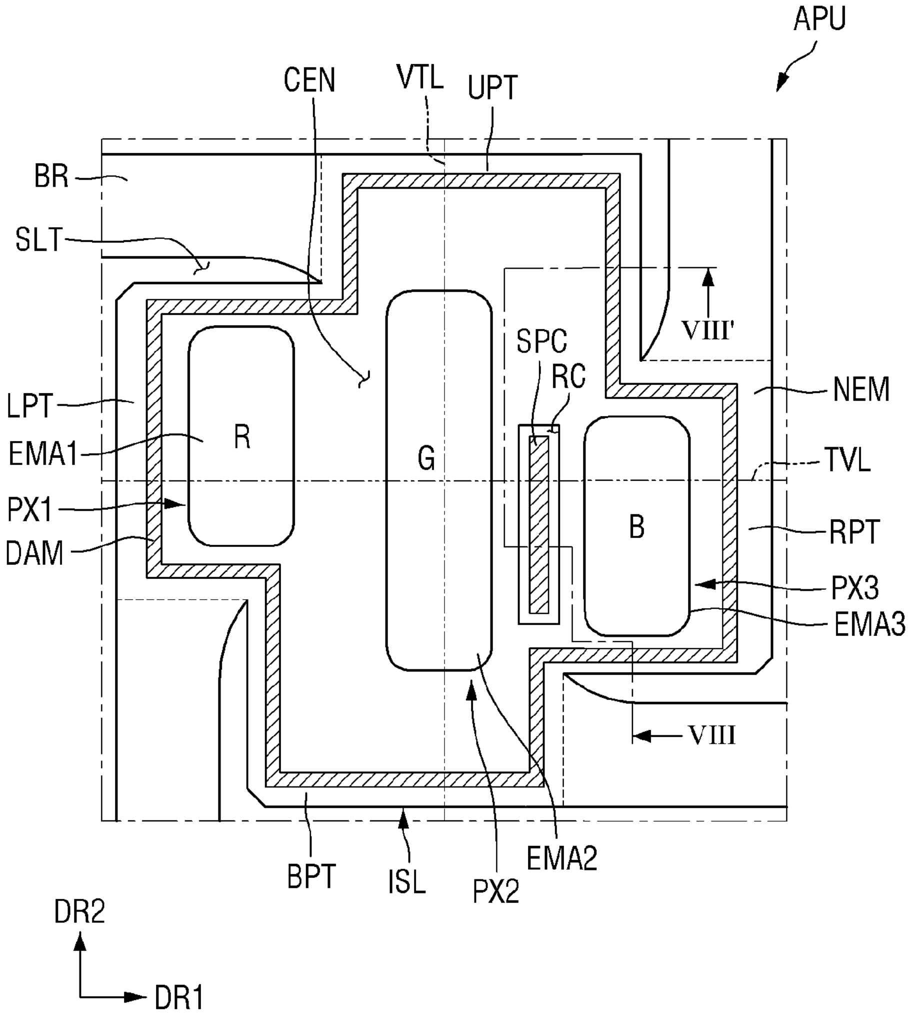
FIG. 5 is a schematic view showing an arrangement pattern unit of the island pattern of FIG. 4.

FIG. 4 is a schematic view showing an arrangement of islands on a substrate at a part of a display device according to some embodiments of the present disclosure. FIG. 5 is a schematic view showing an arrangement pattern unit of the island pattern of FIG. 4. FIG. 5 shows an island ISL in which a spacer SPC and a recess pattern RC are located.

Referring to FIGS. 4 and 5, a substrate SUB (see FIG. 7) of the display device 10 according to some embodiments may include a plurality of islands ISL separated by slits SLT, and a plurality of bridges BR connecting between adjacent ones of the islands ISL. The slits SLT may be openings formed by removing parts of the substrate SUB (see FIG. 7). For example, the substrate SUB (see FIG. 7) may have a shape in which one island ISL and bridges BR connected to the edges of the island ISL are arranged in the first direction DR1 and the second direction DR2.

The island ISL and the bridges BR may be integrally formed and may be at least partially spaced apart from each other to face each other. In other words, at least some parts of the island ISL may be connected to the bridges BR while the other parts of the island ISL may be spaced apart from and face the bridges BR. The slits SLT may be located between the island ISL and the bridges BR spaced apart from each other to face each other. That is to say, the island ISL and the bridges BR may be partially separated by the slits SLT.

The arrangement patterns of the plurality of islands ISL and the bridges BR may be repeated based on substantially the same basic unit (hereinafter referred to as an arrangement pattern unit APU). The arrangement pattern units APUs may have substantially the same arrangement of the islands ISL and bridges BR, and may have substantially the same pattern and the same arrangement of lines or electrodes located therein. Each of the arrangement pattern units APU may have a square or rectangular shape.

The arrangement pattern units APUs may be arranged in succession along the horizontal direction (first direction DR1) and the vertical direction (second direction DR2), and the neighboring arrangement pattern units APUs may be symmetrical to each other with respect to a line perpendicular to the direction in which they are adjacent to each other. For example, the arrangement pattern units APU adjacent to each other in the vertical direction DR2 may have a line-symmetric shape with respect to a boundary line in the horizontal direction DR1 that crosses therebetween. For example, the arrangement pattern units APU adjacent to each other in the vertical direction DR2 may have a line-symmetric shape with respect to a boundary line in the horizontal direction DR1 that crosses therebetween.

The island ISL is located at the center of the arrangement pattern unit APU. The island ISL is located in a single arrangement pattern unit APU, and may be connected to the island ISL of a neighboring arrangement pattern unit APU through the bridges BR. The island ISL may have a generally '+' shape when viewed from the top. For example, the island ISL may have a shape that protrudes from the center area CEN toward the upper side (one side of the second direction DR2), the lower side (the opposite side of the second direction DR2), the left side (one side of the first direction DR1), and the right side (the opposite side of the first direction DR1). The protrusions are all connected to the center area CEN.

The center of gravity of the left protrusion LPT may be arranged higher than the horizontal center line TVL, and the center of gravity of the right protrusion RPT may be arranged lower than the horizontal center line TVL. The left protrusion LPT and the right protrusion RPT have substantially similar areas, and may have a generally point-symmetric relationship with respect to the center of the arrangement pattern unit APU.

The center of gravity of the lower protrusion BPT may be arranged closer to the left side than the vertical center line VTL, and the center of gravity of the upper protrusion UPT may be arranged closer to the right side than the vertical center line VTL. The lower protrusion BPT and the upper protrusion UPT have substantially similar areas, and may have a generally point-symmetric relationship with respect to the center of the arrangement pattern unit APU.

Each of the plurality of bridges BR may be connected to one of the lower side of the left protrusion LPT, the upper side of the right protrusion RPT, the right side of the lower protrusion BPT, and the left side of the upper protrusion UPT of the island ISL. The islands ISL located in the adjacent arrangement pattern units APU, respectively, may be interconnected through the bridges BR traversing the adjacent arrangement pattern units APU.

The slits SLT penetrate the substrate SUB (see FIG. 7) in the thickness direction. That is to say, the substrate SUB (see FIG. 7) may be physically removed at the slits SLT. A material forming the substrate SUB (see FIG. 7) may not be present at the slits SLT. The slits SLT at which the material forming the substrate is not present can be deformed more freely as the display device is expanded and contracted than the parts filled with the material forming the substrate SUB (see FIG. 7). Accordingly, when the display device 10 (refer to FIG. 1) is partially stretched, it is easily stretched and by virtue of the slits SLT, thereby reducing strain applied to the substrate SUB (see FIG. 7).

In addition, the slits SLT may penetrate not only the substrate SUB (see FIG. 7) but also all of the elements arranged on the substrate SUB (see FIG. 7), such as insulating layers, in the thickness direction. That is to say, the slits SLT may be completely empty as an empty space. It is, however, to be understood that embodiments according to the present disclosure are not limited thereto. In this instance, when the display device 10 (see FIG. 1) is partially stretched, it is more easily stretched by virtue of the slits SLT, so that it may be possible to reduce strain applied to the display panel or the substrate SUB (see FIG. 7) of the display device 10 (see FIG. 1).

When the substrate SUB (see FIG. 7) is stretched, the distance between the islands ISL may increase as the bridges BR are stretched. In other words, the area of the slits SLT may be increased. Even so, the shape of the islands ISL may not be deformed. As the shape of the islands ISL is not deformed, the width and height of the islands ISL are not increased or decreased, and thus the structure of the pixels PX formed on the islands ISL may not be deformed.

The entire substrate SUB (see FIG. 7) may be stretchable, but embodiments according to the present disclosure are not limited thereto. In some implementations, only at least a part of the substrate SUB (see FIG. 7) may be stretchable.

One or more pixels PX may be located in each of the arrangement pattern units APUs. For example, a basic pixel group representing full color may be located in each of the arrangement pattern units APUs. As shown in the drawings, three pixels PX1, PX2 and PX3 of red, green and blue, respectively, which are basic units representing full colors, may be arranged in a single arrangement pattern unit APU. As another example, four pixels of red, green, blue and white, respectively may be arranged in a single arrangement pattern unit APU. As another example, two pixels of red and green or blue and green may be arranged in a single arrangement pattern unit APU, or four pixels of red, green, blue and green may be located in a single arrangement pattern unit APU. Beside, two or more basic pixel groups for representing full color may be located in a single repeating unit APU. Other various modifications thereof are possible.

Each pixel PX in the arrangement pattern unit APU includes a pixel electrode. The pixel electrode of a first pixel PX1, the pixel electrode of a second pixel PX2, and the pixel electrode of a third pixel PX3 are respectively connected to different driving transistors to receive separate voltages.

Figure 7:
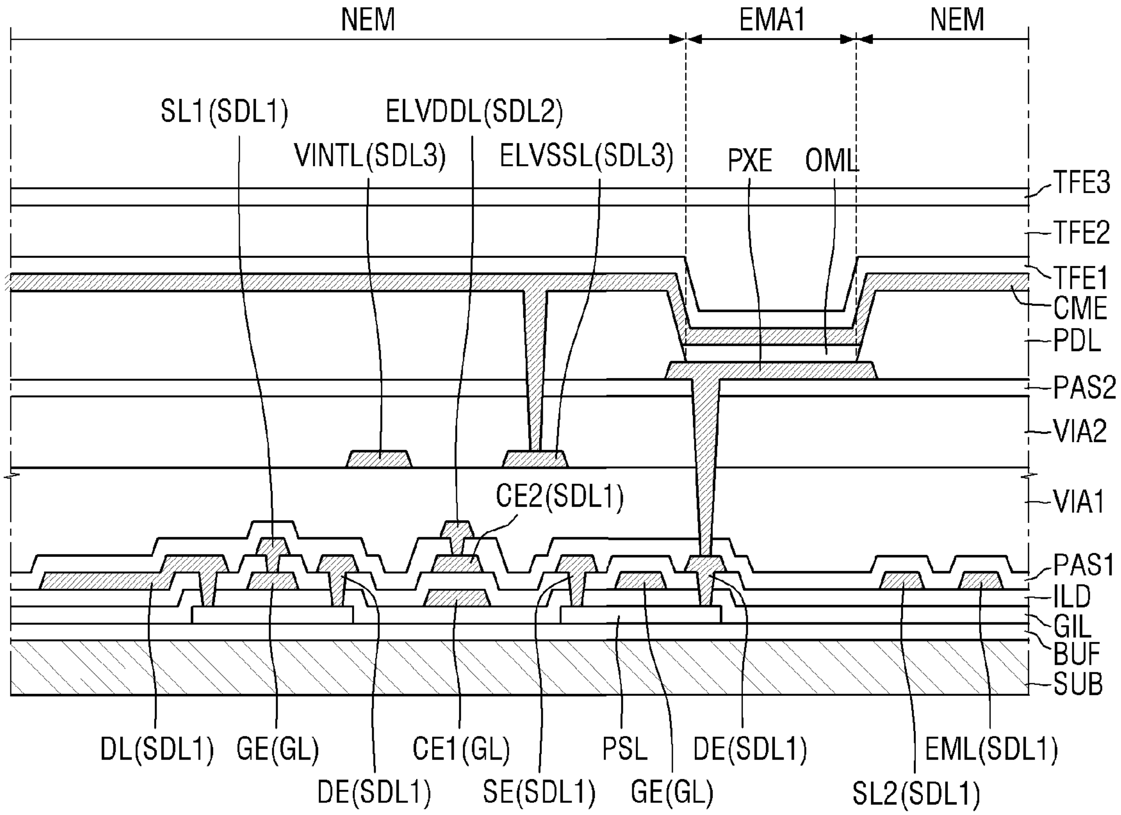
FIG. 7 is a cross-sectional view of a pixel of a display device according to some embodiments of the present disclosure.

The pixel electrodes may be arranged inside the islands ISL of the substrate SUB (see FIG. 7). The pixel electrodes may not be arranged at the slits SLT of the substrate SUB (see FIG. 7). According to some embodiments of the present disclosure, the pixel electrodes of the first pixel PX1, the second pixel PX2 and the third pixel PX3 arranged in a single arrangement pattern unit APU all may be located on a single island ISL.

In order to drive each of the pixel electrodes of the pixels PX, a pixel circuit including a plurality of lines and transistors is required. To this end, a plurality of lines, electrodes, insulating films, semiconductor layers, etc. may be arranged on the substrate SUB (see FIG. 7). The plurality of lines, electrodes, insulating films, semiconductor layers, etc. may be arranged not only on the island ISL but also on the bridge BR, but may not be located at the slits SLT. It is, however, to be understood that embodiments according to the present disclosure are not limited thereto. For example, when a part of the substrate SUB (see FIG. 7) is removed at the slits SLT, and an insulating film or the like is located, a plurality of lines, electrodes, semiconductor layers, etc. may be arranged at the slits SLT.

The display device 10 may further include a first emission area EMA1, a second emission area EMA2, a third emission area EMA3, and a non-emission area NEM. As will be described later, the emission areas EMA1, EMA2 and EMA3 and the non-emission area NEM may be separated by a pixel-defining layer PDL (see FIG. 7).

The emission areas EMA1, EMA2 and EMA3 and the pixels PX1, PX2 and PX3 may be located in each of the arrangement pattern units APUs. The emission areas EMA1, EMA2 and EMA3 and the pixels PX1, PX2 and PX3 may be located on each of the islands ISL. The first emission area EMA1 may be the emission area of the first pixel PX1, the second emission area EMA2 may be the emission area of the second pixel PX2, and the third emission area EMA3 may be the emission area of the third pixel PX3. The emission areas EMA1, EMA2 and EMA3 may be separated by the non-emission area NEM. The shape and size of the emission areas EMA1, EMA2 and EMA3 may be different from one another, but embodiments according to the present disclosure are not limited thereto. They all may be the same.

The display device 10 may further include a dam structure DAM. Although not limited thereto, the dam structure DAM may be arranged in each of the arrangement pattern units APUs. The dam structure DAM may be arranged on each island ISL. When viewed from the top the dam structure DAM may be arranged along the edges of the island ISL, but embodiments according to the present disclosure are not limited thereto. When viewed from the top (e.g., in a plan view), the dam structure DAM may surround the pixels PX1, PX2, and PX3. For example, according to some embodiments, the dam structure DAM may be formed around a group of sub-pixels which form a pixel. When viewed from the top (e.g., in a plan view), the dam structure DAM is arranged outside the emission areas EMA1, EMA2 and EMA3, and may surround the emission areas EMA1, EMA2 and EMA3. In other words, the pixels PX1, PX2 and PX3 and the emission areas EMA1, EMA2 and EMA3 may be arranged inside an area surrounded by the dam structure DAM. For example, at least a part of the dam structure DAM may be arranged on the bridges BR.

The display device 10 may further include spacers SPC and recess patterns RC. The spacers SPC may be arranged in only some of the plurality of arrangement pattern units APUs, but embodiments according to the present disclosure are not limited thereto. The spacer SPC may be arranged in every arrangement pattern unit APU. The spacers SPC may be arranged on the islands ISL and may be located only on some of the plurality of islands ISL. The spacers SPC may be arranged on some of the islands ISL but not on the other islands ISL. In this instance, the pattern in which the spacers SPC are arranged may be repeated along the first direction DR1 and the second direction DR2.

When viewed from the top (e.g., in a plan view), the spacer SPC may be located in the dam structure DAM, and may be surrounded by the dam structure DAM. That is to say, the spacer SPC may be located inside the area surrounded by the dam structure DAM. Accordingly, it may be possible to reduce the area outside the dam structure DAM of the display device 10 while maintaining the area inside the dam structure DAM. Accordingly, more islands ISL can be arranged per given area of the display device 10, and more pixels PX1, PX2 PX3 can be arranged per given area, thereby realizing a higher resolution. It is, however, to be understood that embodiments according to the present disclosure are not limited thereto. When viewed from the top, the spacer SPC may be arranged outside the dam structure DAM. In such case, the spacer SPC may be arranged on the bridge BR.

Although the spacer SPC is spaced apart from the dam structure DAM in the drawings, embodiments according to the present disclosure are not limited thereto. The spacer SPC and the dam structure DAM may be interconnected, in which case, the spacer SPC and the dam structure DAM may be integrally formed.

When viewed from the top, the spacer SPC may be arranged between the second emission area EMA2 and third emission area EMA3 adjacent to each other. In this instance, a discontinuous portion (recess pattern RC) may be located between the pixel-defining layer PDL surrounding the second emission area EMA2 and the pixel-defining layer PDL surrounding the third emission area EMA3 when viewed from the top. When viewed from the top, the spacer SPC may be located in the discontinuous portion. It is, however, to be understood that the present disclosure is not limited thereto. For example, the spacer SPC may be located between the first emission area EMA1 and the second emission area EMA2 adjacent to each other, or may be located on the upper or lower side of the second emission area EMA2 when viewed from the top.

With respect to one or the opposite surface of the substrate SUB (see FIG. 7), the upper surface of the spacer SPC may be located at a higher position than the upper surface of the dam structure DAM. Accordingly, the dam structure DAM can suppress or prevent defects such as dent that may be caused by a fine metal mask (FMM) mask. Moreover, it is possible to suppress or prevent permeation of outside air and moisture, which may occur due to defects such as dent of the dam structure DAM, so that the reliability of the display device 10 (see FIG. 1) can be improved. Detailed descriptions thereon will be given later.

The recess pattern RC may be arranged around the spacer SPC. The recess pattern RC may surround the spacer SPC when viewed from the top. The recess pattern RC may be defined by removing at least a part of an inorganic layer and/or an organic layer. As the recess pattern RC is formed, the spacer SPC is encapsulated by a first inorganic encapsulation layer TFE1, and it may be possible to suppress or prevent permeation of outside air and moisture through the recess pattern RC. Therefore, the reliability of the display device 10 (see FIG. 1) can be improved. Further detailed descriptions thereof will be given later.

Hereinafter, a pixel circuit of one pixel of each display device will be described.

Figure 6:
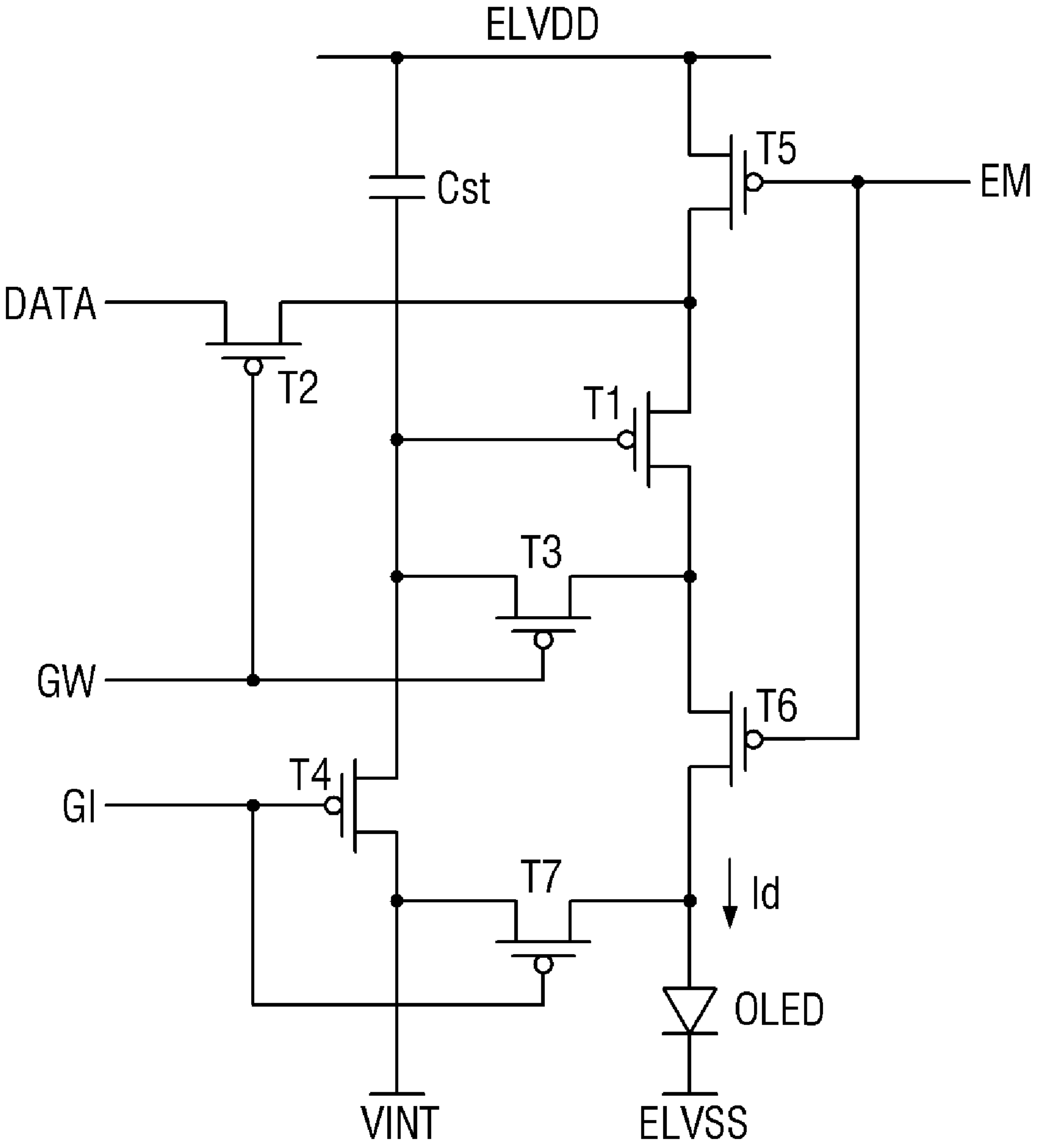
FIG. 6 is a circuit diagram of a pixel of a display device according to some embodiments of the present disclosure.

FIG. 6 is a circuit diagram of a pixel of a display device according to some embodiments of the present disclosure.

The circuit of a pixel of the organic light-emitting display device includes an organic light-emitting diode OLED, a plurality of transistors T1 to T7, and a storage capacitor Cst. A data signal DATA, a first scan signal GW, a second scan signal GI, an emission control signal EM, a first supply voltage ELVDD, a second supply voltage ELVSS, and an initialization voltage VINT are applied to the circuit of one pixel. The data signal DATA may be applied through a data line DL (see FIG. 7). The first scan signal GW and the second scan signal GI may be applied through a first scan line SL1 (see FIG. 7) and a second scan line SL2 (see FIG. 7), respectively. The emission control signal EM may be applied through an emission signal control line EML (see FIG. 7). Similarly, the first supply voltage ELVDD, the second supply voltage ELVSS and the initialization voltage VINT may be applied through a first supply voltage line ELVDDL (see FIG. 7) and a second supply voltage line ELVSSL (see FIG. 7) and an initialization voltage line VINTL (see FIG. 7), respectively.

The organic light-emitting diode OLED includes an anode electrode formed of a pixel electrode PXE (see FIG. 7), a cathode electrode formed of a common electrode CME (see FIG. 7), and an organic material layer OML (see FIG. 7) interposed therebetween.

The storage capacitor Cst includes a first capacitor electrode CE1 (see FIG. 7) and a second capacitor electrode CE2 (see FIG. 7).

The plurality of transistors may include first to seventh transistors T1 to T7. Each transistor includes a gate electrode, a first source/drain electrode, and a second source/drain electrode. One of the first source/drain electrode and the second source/drain electrode may be a source electrode, and the other may be a drain electrode. In the following description, the first source/drain electrode will be abbreviated as a first electrode and the second source/drain electrode will be abbreviated as a second electrode for convenience of illustration.

Each of the transistors T1 to T7 may be a thin-film transistor. Each of the transistors T1 to T7 may be either a PMOS transistor or an NMOS transistor. All of the seven transistors may be of the same type. Alternatively, some of the transistors may be PMOS transistors while the other transistors may be NMOS transistors. In the drawing, all of the seven transistors are implemented as PMOS transistors.

The first transistor T1 is a driving transistor and has the gate electrode connected to the first electrode of the storage capacitor Cst, the first electrode connected to a first supply voltage ELVDD terminal via the fifth transistor T5, and the second electrode connected to the anode electrode of the organic light-emitting diode OLED via the sixth transistor T6. The first transistor T1 receives the data signal DATA from the data line according to the switching operation of the second transistor T2 to supply a driving current Id to the organic light-emitting diode OLED.

The second transistor T2 is a data transfer transistor and has the gate electrode connected to a first scan signal GW terminal, the first electrode connected to a data signal DATA terminal, and the second electrode connected to the first electrode of the first transistor T1 and connected to the first supply voltage ELVDD terminal via the fifth transistor T5. The second transistor T2 is turned on in response to the first scan signal GW to transfer the data signal DATA to the first electrode of the first transistor T1.

The third transistor T3 is a compensation transistor and has the gate electrode connected to the first scan signal GW terminal, the first electrode connected to the second electrode of the first transistor T1 and connected to the anode electrode of the organic light-emitting diode OLED via the sixth transistor T6, and the second electrode connected to the first electrode of the storage capacitor Cst, the first electrode of the fourth transistor T4 and the gate electrode of the first transistor T1. The third transistor T3 is turned on in receives to the first scan signal GW to connect the gate electrode with the second electrode of the first transistor T1, to diode-connect the first transistor T1. Accordingly, a voltage difference equal to the threshold voltage of the first transistor T1 is generated between the first electrode and the gate electrode of the first transistor T1. Deviations in the threshold voltage of the first transistor T1 can be compensated by supplying the data signal DATA that compensates for the threshold voltage to the gate electrode of the first transistor T1.

The fourth transistor T4 is a first initializing transistor and has the gate electrode connected to a second scan signal GI terminal, the second electrode connected to an initialization voltage VINT terminal, and the first electrode connected to the first electrode of the storage capacitor Cst, the second electrode of the third transistor T3 and the gate electrode of the first transistor T1. The fourth transistor T4 is turned on in response to the second scan signal GI to transfer the initialization voltage VINT to the gate electrode of the first transistor T1, to initialize the voltage at the gate electrode of the first transistor T1.

The fifth transistor T5 is a first emission control transistor and has the gate electrode connected to an emission control signal EM terminal, the first electrode connected to the first supply voltage ELVDD terminal, and the second electrode connected to the first electrode of the first transistor T1 and the second electrode of the second transistor T2.

The sixth transistor T6 is a second emission control transistor and has the gate electrode connected to the emission control signal EM terminal, the first electrode connected to the second electrode of the first transistor T1 and the fifth electrode of the third transistor T3, and the second electrode connected to the anode electrode of the organic light-emitting diode OLED.

The fifth transistor T5 and the sixth transistor T6 are simultaneously (or concurrently) turned on in response to the emission control signal EM so that the driving current Id flows through the organic light-emitting diode OLED.

The seventh transistor T7 is a second initialization transistor and has the gate electrode connected to the second scan signal GI terminal, the first electrode connected to the anode electrode of the organic light-emitting diode OLED, and the second electrode connected to the initialization voltage VINT terminal. The seventh transistor T7 is turned on in response to the emission control signal EM to initialize the anode electrode of the organic light-emitting diode OLED.

The second electrode of the storage capacitor Cst is connected to the first supply voltage ELVDD terminal. The first electrode of the storage capacitor Cst is connected to the gate electrode of the first transistor T1, the second electrode of the third transistor T3 and the first electrode of the fourth transistor T4. The cathode electrode of the organic light-emitting diode OLED is connected to the second supply voltage ELVSS terminal. The organic light-emitting diode OLED receives the driving current Id from the first transistor T1 and emits light to display an image.

The illustrated pixel circuit structure can be variously modified. For example, it may have a 2T1C structure including two transistors, i.e., a first transistor and a second transistor, and one capacitor. Alternatively, it may have 3T1C, 3T2C, 6T1C structure, etc., or may be modified and applied in various forms known in the art.

FIG. 7 is a cross-sectional view of a pixel of a display device according to some embodiments of the present disclosure. FIG. 7 is a cross-sectional view of the first pixel PX1, especially showing cross-sections of the first transistor and the second transistor among the plurality of transistors of FIG. 6. It is to be understood that the description on the first pixel PX1 can be equally applied to the second pixel PX2 and the third pixel PX3. In FIG. 7, the second source/drain electrode DE of the first transistor is connected directly to the pixel electrode PXE without the sixth transistor for convenience of illustration. In addition, the slits SLT of the substrate SUB are not depicted in FIG. 7. In the following description, the first pixel PX1 is referred to as a pixel PX for convenience of illustration.

Referring to FIG. 7, the display device includes the substrate SUB. According to some embodiments, the substrate SUB may have a stack structure of multiple layers. In such case, an inorganic layer and/or an amorphous silicon layer may be further located between the layers. The substrate SUB may include a flexible polymer. Description thereon has been made above; and, therefore, the redundant descriptions will be omitted.

A buffer layer BUF is located on the substrate SUB. The buffer layer BUF may prevent impurity ions from diffusing, may prevent or reduce permeation of moisture, outside air, or other contaminants, and may provide a flat surface.

A semiconductor layer PSL is located on the buffer layer BUF. The semiconductor layer PSL forms a channel of a thin-film transistor of the pixel PX. The semiconductor layer PSL may include polycrystalline silicon. It is, however, to be understood that embodiments according to the present disclosure are not limited thereto. The semiconductor layer PSL may include monocrystalline silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium (In), zinc (Zn), gallium (Ga), tin (Sn), titanium (Ti), aluminum (Al), hafnium (Hf), zirconium (Zr), magnesium (Mg), etc.

A gate insulator GIL is arranged on the semiconductor layer PSL. A gate conductive layer GL is arranged on the gate insulator GIL. The gate conductive layer GL may include a gate electrode GE of the thin-film transistor of the pixel PX and a first electrode CE1 of the storage capacitor. The gate conductive layer GL may include at least one metal selected from the group consisting of: molybdenum (Mo), aluminum (Al) platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The gate electrode GL may be a single layer or a multiple layers.

An interlayer dielectric layer ILD is arranged on the gate conductive layer GL. A source/drain conductive layer SDL is arranged on the interlayer dielectric layer ILD. The source/drain conductive layer SDL may include a plurality of conductive layers separated by an insulating layer. For example, the source/drain conductive layer may include a first source/drain conductive layer SDL1, a second source/drain conductive layer SDL2, and a third source/drain conductive layer SDL3. A first passivation layer PAS1 may be formed as an insulating layer between the first source/drain conductive layer SDL1 and the second source/drain conductive layer SDL2. A first planarization layer VIA1 may be formed as an insulating layer between the second source/drain conductive layer SDL2 and the third source/drain conductive layers SDL3. A second planarization layer VIA2 may be formed on the third source/drain conductive layer SDL3, and a second passivation layer PAS2 may be formed on the second planarization layer VIA2.

The source/drain conductive layer SDL may include at least one metal selected from the group consisting of: aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The source/drain conductive layer SDL may be made up of a single layer or multiple layers. For example, the source/drain conductive layer SDL may have a stack structure of Ti/Al/Ti, Mo/Al/Mo, Mo/AlGe/Mo, and Ti/Cu.

A variety of lines and electrodes forming the pixel circuit may be formed as the source/drain conductive layer SDL.

For example, the first source/drain conductive layer SDL1 may include the data line DL, and the first source/drain electrode SE and the second source/drain electrode DE of the thin-film transistor. In addition, some of the first scan line SL1, the second scan line SL2, and the emission signal control line may also be formed as the first source/drain conductive layer SDL1. The first scan line SL1, the second scan line SL2 and the emission signal control line EML may be electrically connected to the gate conductive layer GL thereunder through contact holes penetrating the interlayer dielectric layer ILD. Moreover, the second electrode CE2 of the storage capacitor may also be formed as the first source/drain conductive layer SDL1. The second source/drain conductive layer SDL2 may include the first supply voltage line ELVDDL, and the third source/drain conductive layer SDL3 may include the second supply voltage line ELVSSL and the initialization voltage line VINTL.

The numbers of the gate conductive layers GL and the source/drain conductive layers SDL, or the lines included in each source/drain conductive layer SDL may be altered in a variety of ways depending on the layout or the like. For example, a separate gate conductive layer forming the second electrode CE2 of the storage capacitor may be further arranged between the gate conductive layer GL and the first source/drain conductive layer SDL1. In some implementations, the gate conductive layer GL may be eliminated, and the gate electrode, the scan line and the first electrode CE1 of the storage capacitor, etc. may be formed by the source/drain conductive layers SDL. An example layout of the source/drain conductive layer SDL will be described in more detail later.

The second passivation layer PAS2 is located on the third source/drain conductive layer SDL3. The pixel electrode PXE is located on the second passivation layer PAS2. The pixel electrode PXE may be electrically connected to the second source/drain electrode DE of the thin-film transistor (first transistor). The pixel electrode PXE may have a stack structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof. The layer having a high work function may be arranged above the reflective material layer so that it is located closer to the organic material layer OML. The pixel electrodes PXE may have, but is not limited to, a multilayer structure of ITO/Mg, ITO/MgF, ITO/Ag, and ITO/Ag/ITO.

The pixel-defining layer PDL may be located on the pixel electrode PXE. The pixel-defining layer PDL may include an opening exposing the pixel electrode PXE. The organic material layer OML (or emissive layer) is located in the opening of the pixel-defining layer PDL. The organic material layer OML may be located on the pixel electrode PXE exposed by the pixel-defining layer PDL. The organic material layer OML may include an organic emissive layer, a hole injecting/transporting layer, and an electron injecting/transporting layer.

A common electrode CME is located on the organic material layer OML and the pixel-defining layer PDL. The common electrode CME may be located on the entire surface of each of the pixels PX. The common electrode CME may be arranged throughout the entire area of each island ISL. Alternatively, the common electrode CME may be arranged throughout the entire area of each island ISL and each bridge BR. It is, however, to be understood that the area in which the common electrode CME is arranged is not limited thereto. In addition, the common electrode CME may be arranged on side surfaces of each of the stacked elements that are exposed by the slits SLT.

The common electrode CME may include a material layer having a small work function such as Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The common electrode CME may further include a transparent metal oxide layer located on the material layer having a small work function. The common electrode CME may be connected to the second supply voltage line ELVSSL formed as the third source/drain conductive layer SDL3 through a contact hole penetrating the pixel-defining layer PDL, the second passivation layer PAS2 and the second planarization layer VIA2.

An encapsulation layer TFE may be located on the common electrode CME. The encapsulation layer TFE may include a first inorganic encapsulation layer TFE1, an organic encapsulation layer TFE2, and a second inorganic encapsulation layer TFE3.

Each of the buffer layer BUF, the gate insulator GIL, the interlayer dielectric layer ILD, the first passivation layer PAS1 and the second passivation layer PAS2 may include an inorganic insulating material such as silicon oxide, silicon nitride, silicon oxynitride, hafnium oxide, aluminum oxide, titanium oxide, tantalum oxide and zinc oxide.

The first planarization layer VIA1, the second planarization layer VIA2 and the pixel-defining layer PDL may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB).

However, the material forming the insulating layer is not limited to those listed above. It is to be understood that any of a variety of materials known in the art may be applied as the constituent material for each insulating layer.

The dam structure DAM and the spacer SPC will be described in more detail with reference to FIG. 8.

Figure 8:
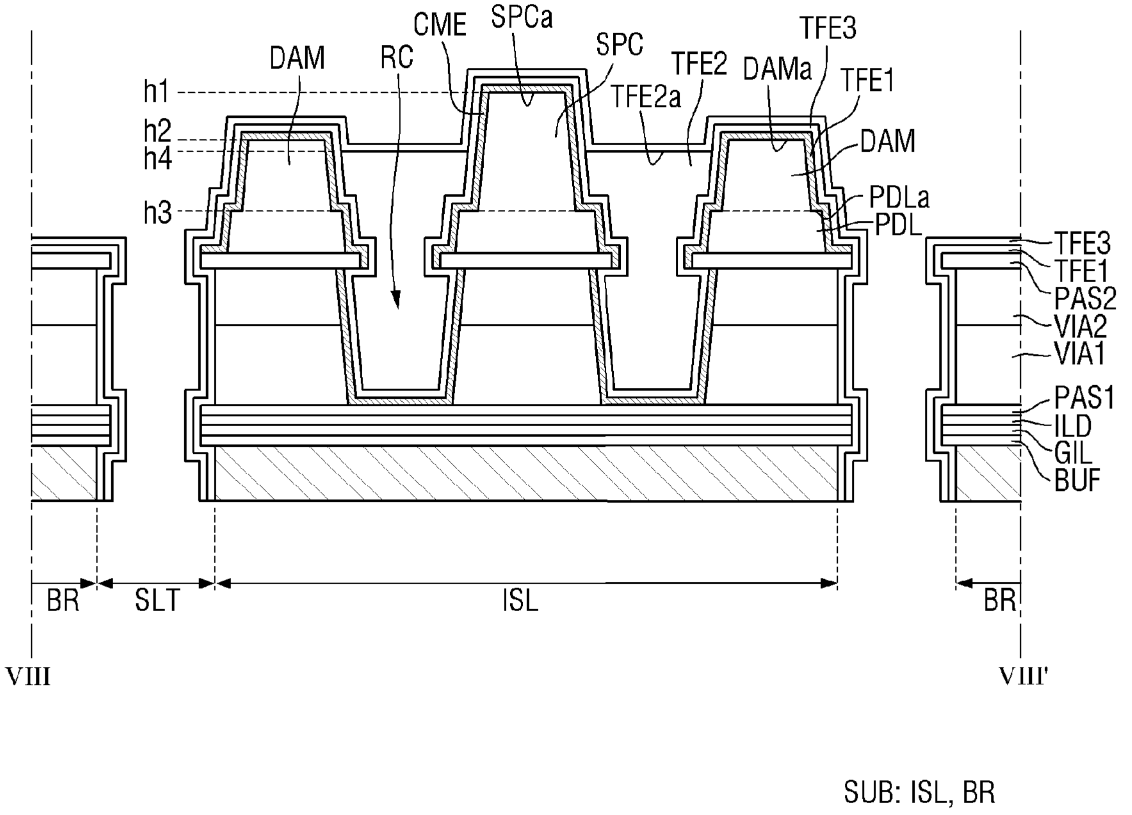
FIG. 8 is a cross-sectional view taken along the line VIII-VIII' of FIG. 5.

FIG. 8 is a cross-sectional view taken along the line VIII-VIII' of FIG. 5. Although some of the semiconductor layers and conductive layers described above with reference to FIG. 7 are eliminated in the example shown in FIG. 8 for convenience of illustration, embodiments according to the present disclosure are not limited thereto.

Referring to FIG. 8, the dam structure DAM and the spacer SPC may be located on the pixel-defining layer PDL. The pixel-defining layer PDL and the dam structure DAM may be formed integrally, and the pixel-defining layer PDL and the spacer SPC may be formed integrally. It is, however, to be understood that the present disclosure is not limited thereto. The dam structure DAM and the spacer SPC may include an organic insulating material. The organic insulating material may be substantially identical to the organic insulating material of the pixel-defining layer PDL, but embodiments according to the present disclosure are not limited thereto.

The pixel-defining layer PDL, the dam structure DAM and the spacer SPC may be formed via a single process through a half-tone mask. It is, however, to be understood that embodiments according to the present disclosure are not limited thereto. The spacer SPC may be formed via a separate process after the pixel-defining layer PDL and the dam structure DAM have been formed through a halftone mask.

The dam structure DAM can suppress or prevent or reduce instances of an organic material such as the organic encapsulation layer TFE2 overflowing to the outside of the dam structure DAM. As the dam structure DAM is arranged, the organic encapsulation layer TFE2 may be located only inside the dam structure DAM and not outside the dam structure DAM. It is to be noted that the first inorganic encapsulation layer TFE1 and the second inorganic encapsulation layer TFE3 may be arranged outside the dam structure DAM. The first inorganic encapsulation layer TFE1 and the second inorganic encapsulation layer TFE3 may be in contact with each other on the dam structure DAM, may encapsulate the organic encapsulation layer TFE2, and may be terminated on the dam structure DAM. It is, however, to be understood that embodiments according to the present disclosure are not limited thereto.

The first inorganic encapsulation layer TFE1 and the second inorganic encapsulation layer TFE3 may be arranged not only on the island ISL and the bridge BR of the substrate SUB but also at the slit SLT. The first inorganic encapsulation layer TFE1 and the second inorganic encapsulation layer TFE3 may be arranged on the side surfaces of the islands ISL, the bridge BR, the buffer layer BUF, the gate insulating layer GIL, the interlayer dielectric layer ILD, the first passivation layer PAS1, the first planarization layer VIA1, the second planarization layer VIA2, and the first passivation layer PAS2 of the substrate SUB, which are exposed by the slits SLT. Accordingly, it may be possible to suppress or prevent permeation of outside air and moisture through the slits SLT.

The spacer SPC may be formed at a higher position than the dam structure DAM. For example, with respect to one or the opposite surface of the substrate SUB, the upper surface SPCa of the spacer SPC may be located at a high position than the upper surface PDLa of the pixel-defining layer PDL and the upper surface DAMa of the dam structure DAM. In addition, the upper surface DAMa of the dam structure DAM may be located at a position equal to or higher than the upper surface TFE2*a* of the organic encapsulation layer TFE2 with respect to the one or the opposite surface of the substrate SUB.

For example, the upper surface SPCa of the spacer SPC may be located at a first height h1 from the one or the opposite surface of the substrate SUB. The upper surface DAMa of the dam structure DAM may be located at a second height h2 from the one surface or the opposite surface of the substrate SUB. The upper surface PDLa of the pixel-defining layer PDL may be located at a third height h3 from the one or the opposite surface of the substrate SUB. The upper surface TFE2*a* of the organic encapsulation layer TFE2 may be located at a fourth height h4 from the one or the opposite surface of the substrate SUB. In this instance, with respect to the one or the opposite surface of the substrate SUB, the fourth height h4 may be higher than the third height h3, and the second height h2 may be equal to or higher than the fourth height h4, and the first height h1 may be higher than the second height h2. The heights of the upper surfaces may mean average heights of the upper surfaces.

At least a part of the spacer SPC may protrude above the organic encapsulation layer TFE2. For example, the organic encapsulation layer TFE2 may be located on the spacer SPC, and the spacer SPC may penetrate the organic encapsulation layer TFE2 in the thickness direction and protrude upward from the organic encapsulation layer TFE2. The first inorganic encapsulation layer TFE1 may be located on the spacer SPC, and the first inorganic encapsulation layer TFE1 located on the spacer SPC may protrude above the organic encapsulation layer TFE2. The first inorganic encapsulation layer TFE1 protruding above the organic encapsulation layer TFE2 may be in direct contact with the second inorganic encapsulation layer TFE3. That is to say, the spacer SPC and the second inorganic encapsulation layer TFE3 may include an overlapping region where they overlap each other in the thickness direction. In this case, the first inorganic encapsulation layer TFE1 may be located between the spacer SPC and the second inorganic encapsulation layer TFE3 in the overlapping region, and the first inorganic encapsulation layer TFE1 arranged in the overlapping region may be in direct contact with the second inorganic encapsulation layer TFE3.

It is, however, to be understood that embodiments according to the present disclosure are not limited thereto. At least a part of the upper surface TFE2*a* of the organic encapsulation layer TFE2 may be located at a higher position than the upper surface SPCa of the spacer SPC. In such case, the organic encapsulation layer TFE2 covers the spacer SPC, and the spacer SPC may not protrude above the organic encapsulation layer TFE2.

In addition, when the common electrode CME is arranged on the spacer SPC, the spacer SPC protrudes above the organic encapsulation layer TFE2, and thus the common electrode CME arranged on the spacer SPC may protrude above the organic encapsulation layer TFE2.

When the upper surface SPCa of the spacer SPC is located at a higher position than the upper surface DAMa of the dam structure DAM, it may be possible to suppress or prevent or reduce defects such as dent which may occur by a FMM mask or the like in the dam structure DAM even when the FMM mask or the like is placed above the spacer SPC. That is to say, because the FMM mask or the like is brought into contact with the spacer SPC before the dam structure DAM, it may be possible to suppress or prevent defects such as dent on the dam structure DAM. Accordingly, it may be possible to suppress or prevent permeation of outside air and moisture due to defects such as dent in the dam structure DAM, so that the reliability of the display device can be improved.

In addition, even if defects such as dent occur by the FMM mask or the like on the spacer SPC, the spacer SPC is smaller than the dam structure DAM when viewed from the top, such that the outside air or moisture may permeate less through the spacer SPC than through the dam structure DAM. Accordingly, it may be possible to suppress or prevent the reliability of the display device from being decreased.

Although not limited thereto, the surface roughness of the upper surface SPCa of the spacer SPC may be greater than the surface roughness of the upper surface DAMa of the dam structure DAM. Although not limited thereto, when the upper surface SPCa of the spacer SPC is in contact with the FMM mask or the like and is damaged by the FMM mask or the like, the surface roughness of the upper surface SPCa of the spacer SPC may become greater.

The recess pattern RC may penetrate through the pixel-defining layer PDL, the second passivation layer PAS2, the second planarization layer VIA2 and the first planarization layer VIA1 in the thickness direction. The recess pattern RC may be defined by the pixel-defining layer PDL, the second passivation layer PAS2, the second planarization layer VIA2 and the first planarization layer VIA1. The recess pattern RC may be defined by removing at least a part of the pixel-defining layer PDL, the second passivation layer PAS2, the second planarization layer VIA2 and the first planarization layer VIA1. In such case, the sidewalls of the recess pattern RC may be formed of the pixel-defining layer PDL, the second passivation layer PAS2, the second planarization layer VIA2 and the first planarization layer VIA1.

The recess pattern RC may expose the first passivation layer PAS1. In such case, the bottom surface of the recess pattern RC may be formed of, but is not limited to, the first passivation layer PAS1.

The side surfaces of the second passivation layer PAS2 forming the sidewalls of the recess pattern RC may protrude outward from the side surfaces of the pixel-defining layer PDL, the second planarization layer VIA2, and the first planarization layer VIA1 forming the sidewall of the recess pattern RC. In other words, the recess pattern RC may include one sidewall and the opposite sidewall opposed to each other. In such case, the side surfaces of the second passivation PAS2 may protrude more toward the opposite sidewall of the recess pattern RC than the side surfaces of the pixel-defining layer PDL, the second passivation layer PAS2, the second planarization layer VIA2 forming the one sidewall of the recess pattern RC.

At least a part of the common electrode CME may be arranged in the recess pattern RC. For example, the common electrode CME may be arranged on the side surfaces of the pixel-defining layer PDL, the second passivation layer PAS2, the second planarization layer VIA2 and the first planarization layer VIA1 forming the sidewalls of the recess pattern RC. In addition, the common electrode CME may be arranged on the upper surfaces of the second passivation layer PAS2 and the first passivation layer PAS1 protruding outward. It is to be noted that the common electrode CME may not be formed on the lower surface of the second passivation layer PAS2 protruding outward.

At least a part of the first inorganic encapsulation layer TFE1 may be formed in the recess pattern RC. The first inorganic encapsulation layer TFE1 formed in the recess pattern RC may be arranged along the surface of the recess pattern RC. For example, the first inorganic encapsulation layer TFE1 formed in the recess pattern RC may be arranged on the surfaces of the pixel-defining layer PDL, the second passivation layer PAS2, the second planarization layer VIA2, the first planarization layer VIA1 and the first passivation layer PAS1 forming the sidewalls of the recess pattern RC may be arranged continuously along the surfaces. It is to be noted that when the common electrode CME is arranged on the recess pattern RC, the first inorganic encapsulation layer TFE1 may be arranged on the common electrode CME. Accordingly, the spacer SPC and the elements under the spacer SPC can be encapsulated by the first inorganic encapsulation layer TFE1, and thus it may be possible to suppress, prevent, or reduce permeation of outside air and moisture.

As the side surfaces of the second passivation layer PAS2, which is an inorganic film, protrude outward from the other side surfaces, the second passivation layer PAS2 may be in direct contact with the first inorganic encapsulation layer TFE1, and the first inorganic encapsulation layer TFE1 can be more reliably encapsulate the elements. In other words, the common electrode CME may not be arranged on the lower surface of the second passivation layer PAS2 protruding outward, and the second passivation layer PAS2 may be arranged on the other surface (lower surface) of the second passivation layer PAS2 protruding outward. Accordingly, the second passivation layer PAS2 may be in direct contact with the first inorganic encapsulation layer TFE1.

Although the buffer layer BUF, the gate insulator GIL, the interlayer dielectric layer ILD, the first passivation layer PAS1, the first planarization layer VIA1, the second planarization layer VIA2, the second passivation layer PAS2, the first inorganic encapsulation layer TFE1 and the second inorganic encapsulation layer TFE3 are located on the bridge BR of the substrate SUB in the drawings, the present disclosure is not limited thereto. For example, some of the elements may be eliminated or other elements may be added.

Hereinafter, other example embodiments of the present disclosure will be described in more detail. In the following description, the same or similar elements will be denoted by the same or similar reference numerals, and redundant descriptions will be omitted or briefly described. Descriptions will be made focusing on differences from the above described embodiments.

Figure 9:
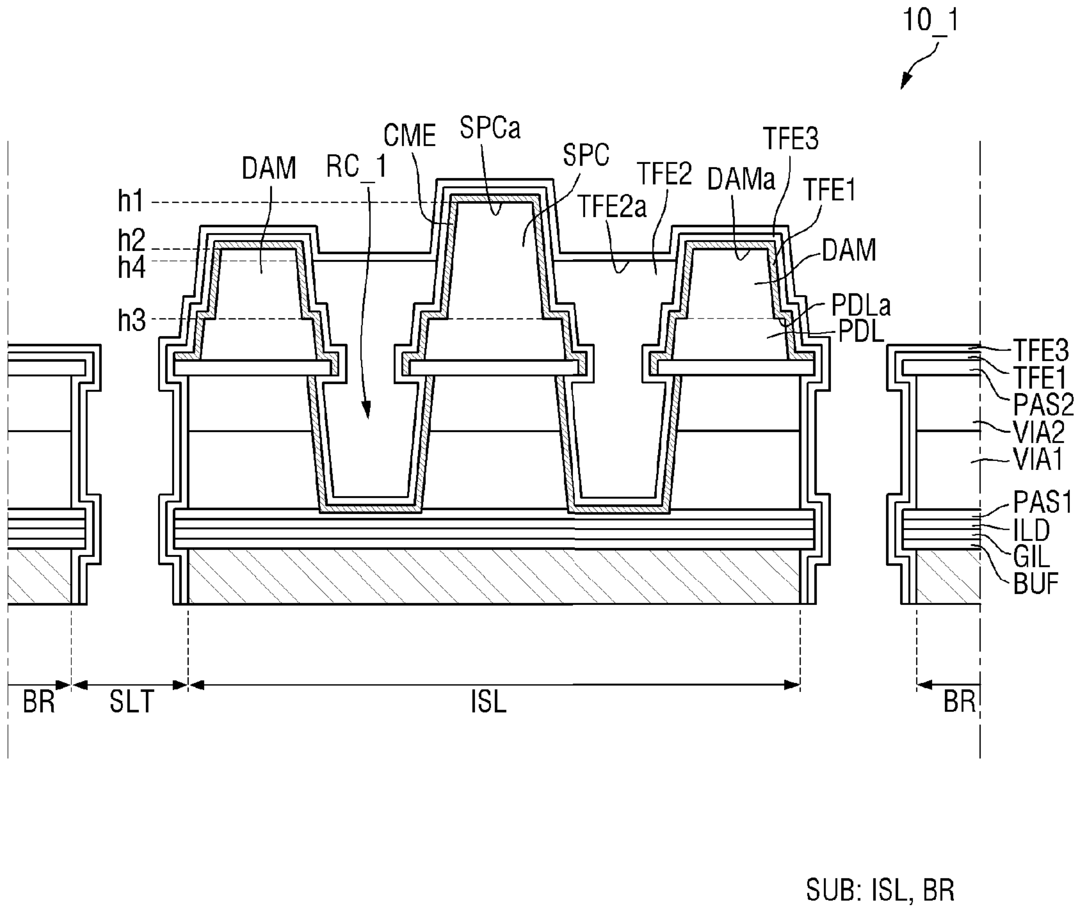
FIG. 9 is a cross-sectional view of a display device according to some embodiments of the present disclosure.

FIG. 9 is a cross-sectional view of a display device according to some embodiments of the present disclosure.

The example embodiments described with respect to FIG. 9 is different from the example embodiments described with respect to FIG. 8 in that sidewalls of a recess pattern RC_1 of a display device 10_1 further includes a first passivation layer PAS1.

For example, during the process of removing the pixel-defining layer PDL, the second passivation layer PAS2, the second planarization layer VIA2 and the first planarization layer VIA1, a part of the first passivation layer PAS1 thereunder may be removed together. Accordingly, the sidewalls of the recess pattern RC_1 may further include the side surfaces of the first passivation layer PAS1 in addition to the side surfaces of the pixel-defining layer PDL, the second passivation layer PAS2, the second planarization layer VIA2 and the first planarization layer VIA1. In addition, the bottom surface of the recess pattern RC_1 may be formed of the first passivation layer PAS1.

Also in this instance, as the upper surface SPCa of the spacer SPC is located at a higher position than the upper surface DAMa of the dam structure DAM from one or the opposite surface of the substrate SUB, it may be possible to prevent or reduce defects such as dent on the dam structure DAM. In addition, even though a part of the first passivation layer PAS1 is etched out, the first inorganic encapsulation layer TFE1 can be in direct contact with the first passivation layer PAS1, and the spacer SPC can be encapsulated.

Figure 10:
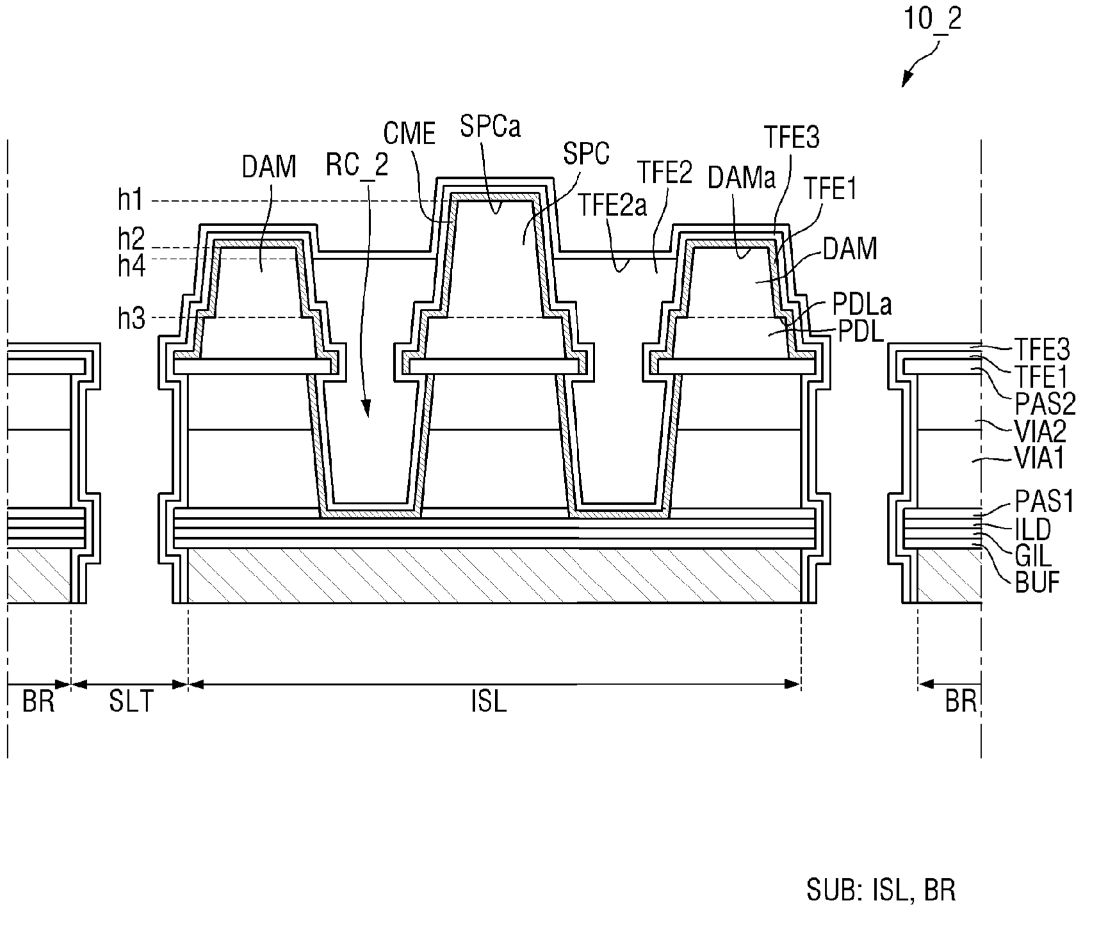
FIG. 10 is a cross-sectional view of a display device according to some embodiments of the present disclosure.

FIG. 10 is a cross-sectional view of a display device according to some embodiments of the present disclosure.

The example embodiments described with respect to FIG. 10 are different from the example embodiments described with respect to FIG. 9 in that a bottom surface of a recess pattern RC_2 of a display device 10_2 is formed of an interlayer dielectric layer ILD. In this instance, the first passivation layer PAS1 is penetrated in the thickness direction, and the first inorganic layer TFE1 may be in direct contact with the interlayer dielectric layer ILD.

Also in this instance, as the upper surface SPCa of the spacer SPC is arranged at a higher position than the upper surface DAMa of the dam structure DAM from one or the opposite surface of the substrate SUB, it may be possible to prevent defects such as dent on the dam structure DAM. In addition, even though the first passivation layer PAS1 is penetrated in the thickness direction, the first inorganic encapsulation layer TFE1 can be in direct contact with the interlayer dielectric layer ILD, and the spacer SPC can be encapsulated.

Figure 11:
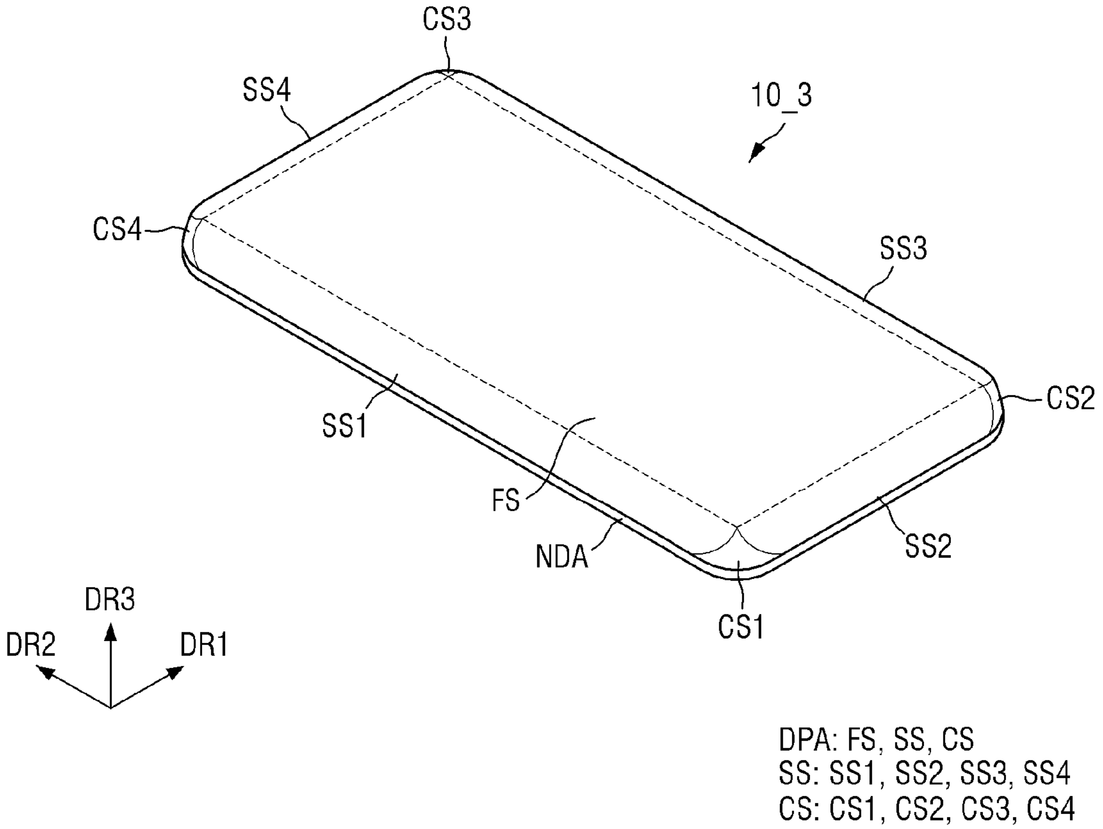
FIG. 11 is a perspective view of a display device according to some embodiments of the present disclosure.
Figure 12:
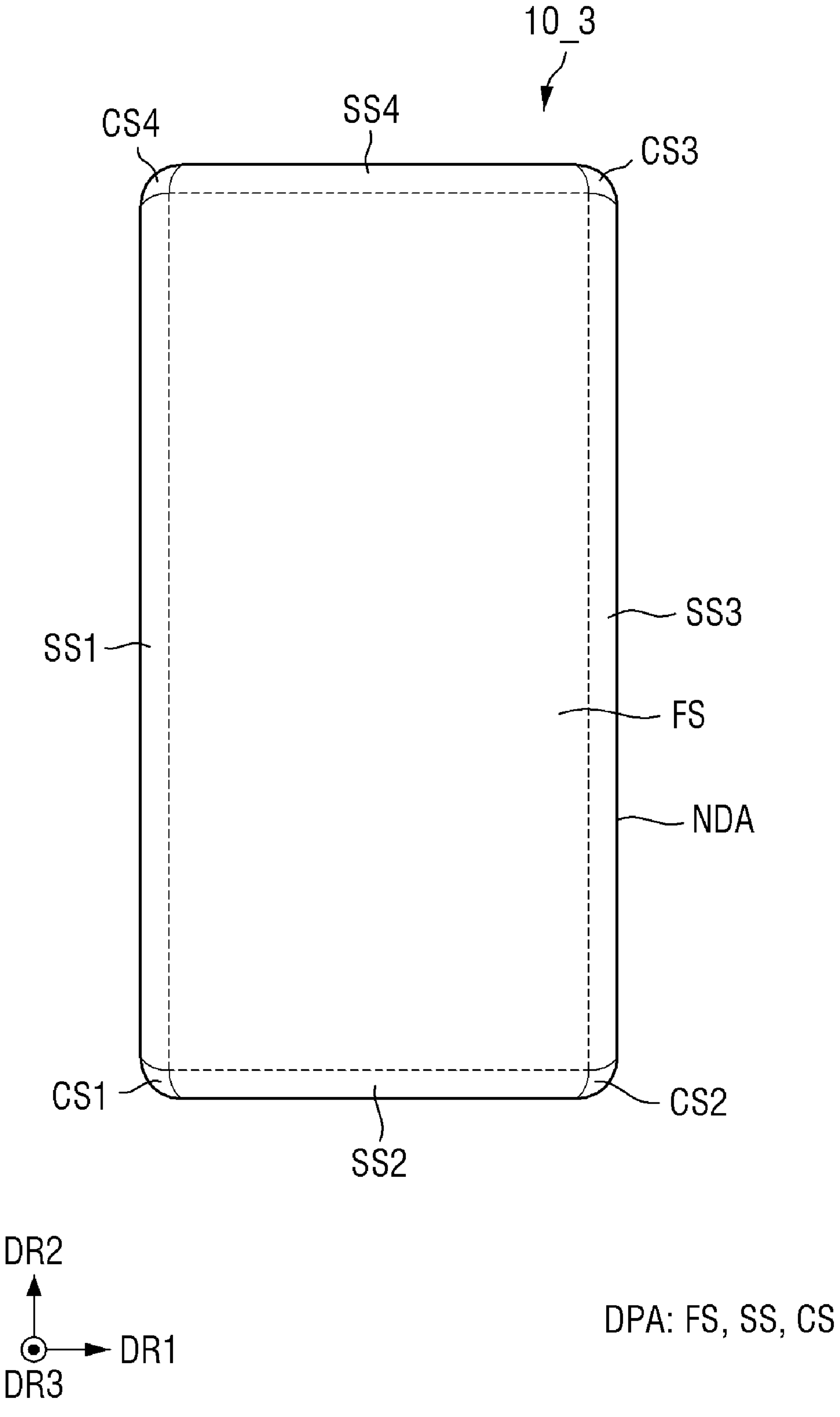
FIG. 12 is a plan view of the display device of FIG. 11.
Figure 13:
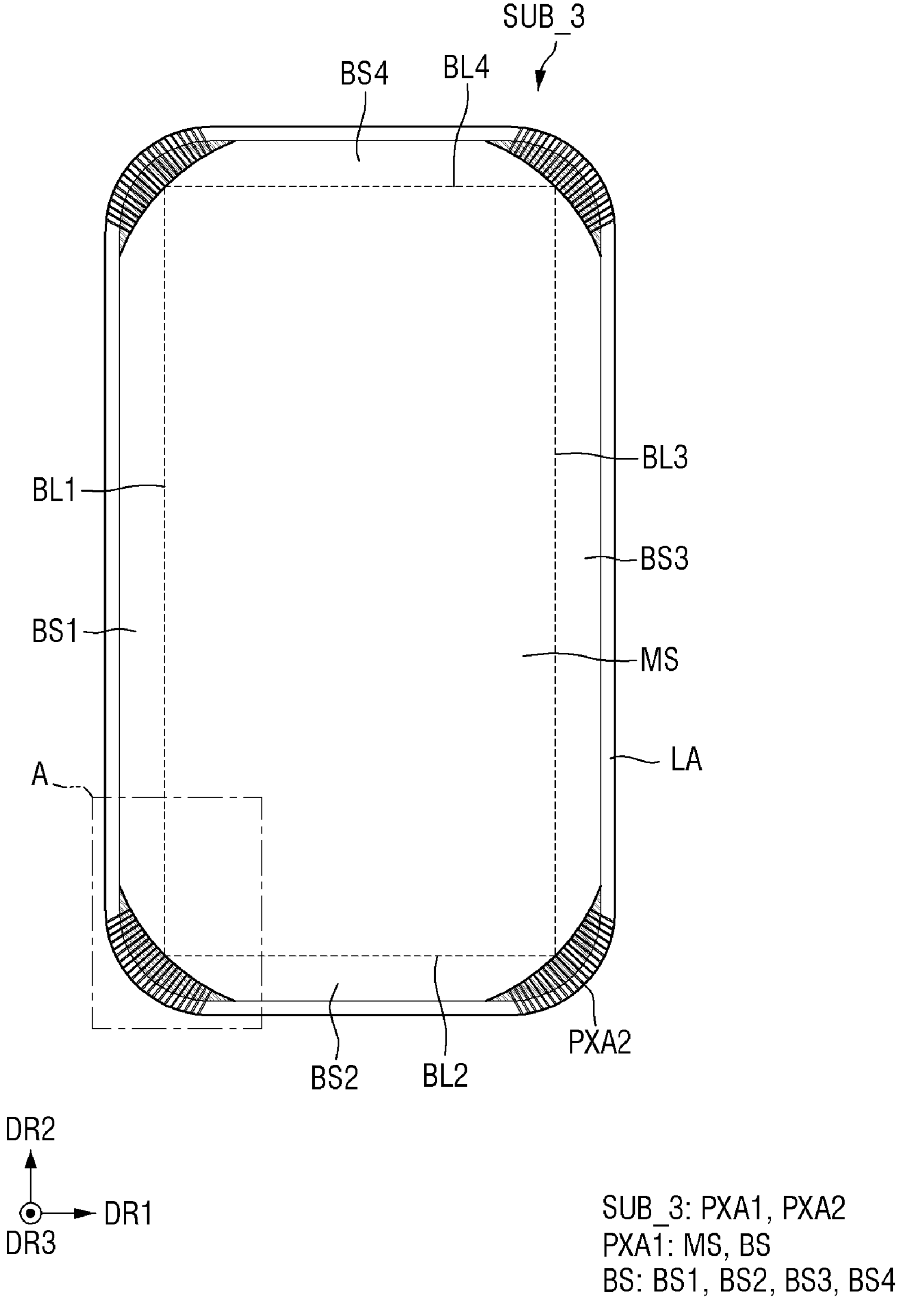
FIG. 13 is an expanded view of a display device according to some embodiments of the present disclosure.
Figure 14:
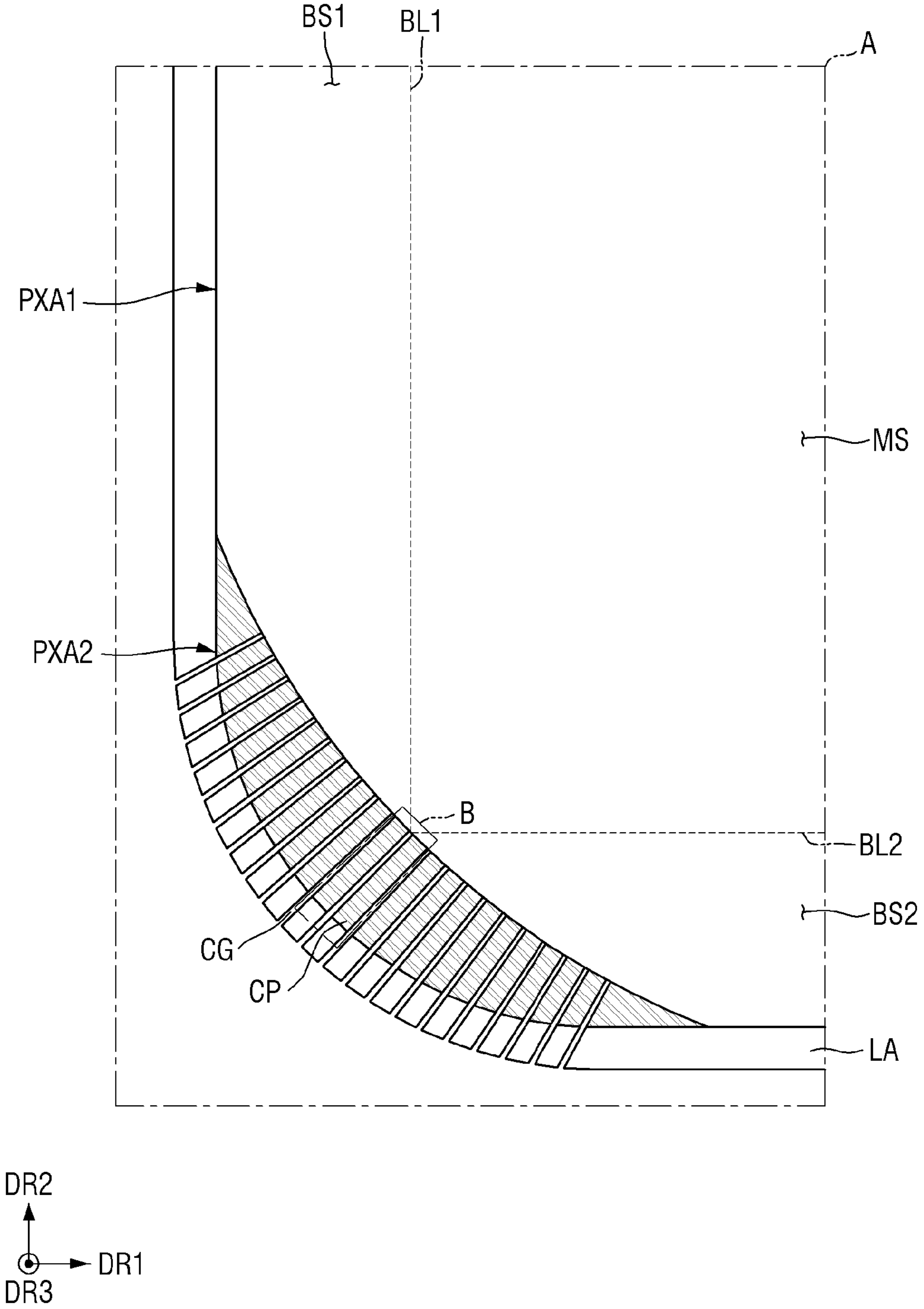
FIG. 14 is an enlarged view of the portion A of FIG. 13.
Figure 15:
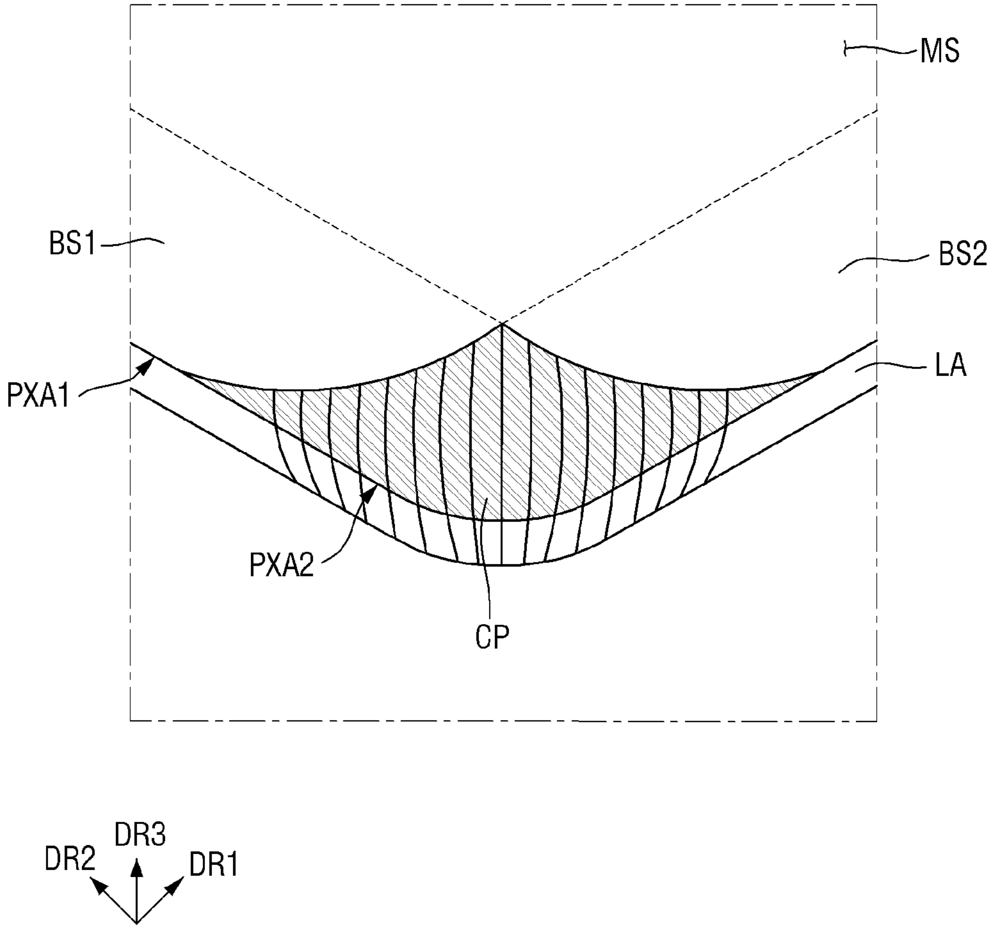
FIG. 15 is a part of a perspective view of a display device according to some embodiments of the present disclosure.
Figure 16:
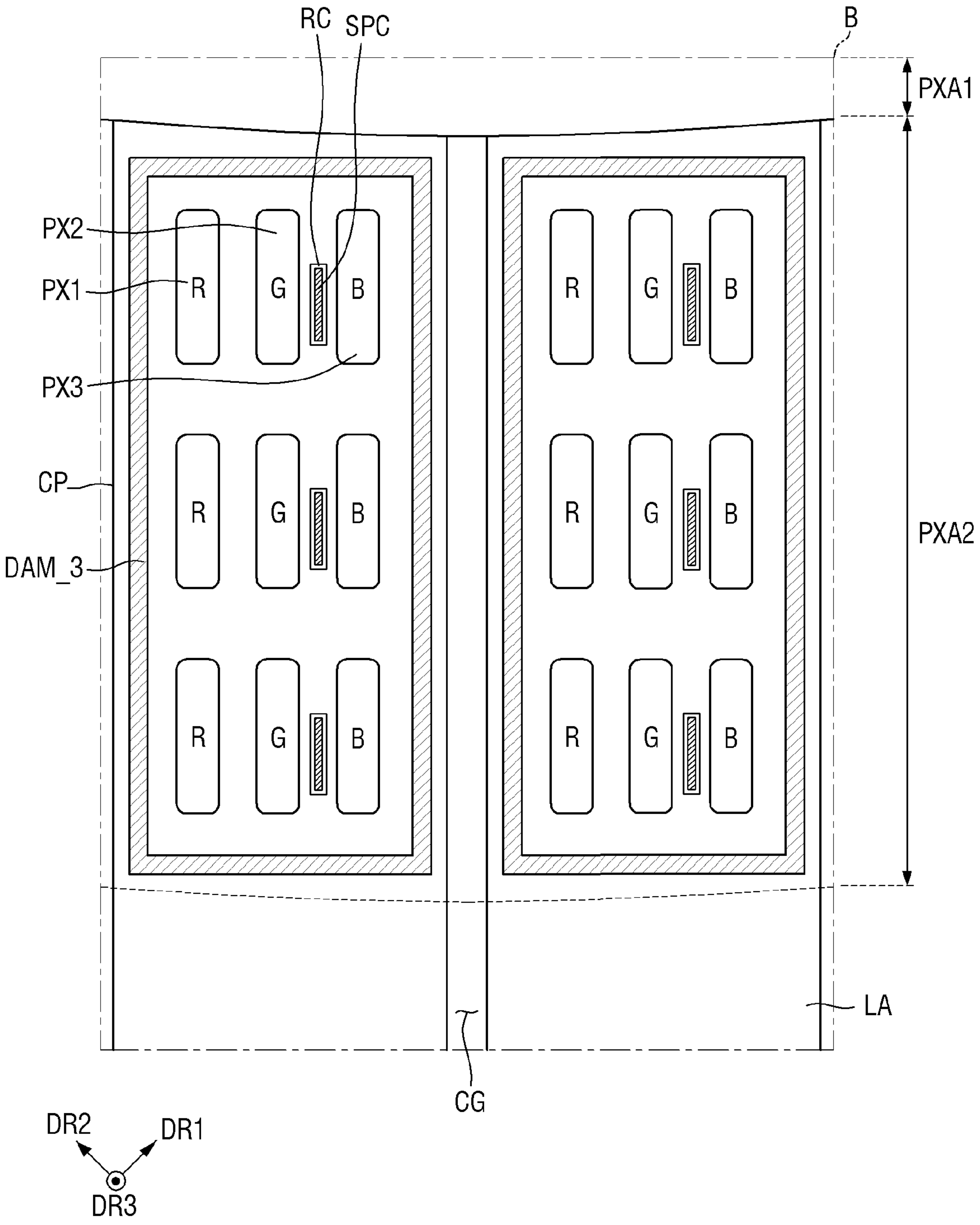
FIG. 16 is an enlarged view of area B of FIG. 14.

FIG. 11 is a perspective view of a display device according to some embodiments of the present disclosure. FIG. 12 is a plan view of the display device of FIG. 11. FIG. 13 is an expanded view of a display device according to some embodiments of the present disclosure. FIG. 14 is an enlarged view of area A of FIG. 13. FIG. 15 is a part of a perspective view of a display device according to some embodiments of the present disclosure. FIG. 16 is an enlarged view of area B of FIG. 14.

The example embodiments described with respect to FIGS. 11 to 16 are different from the example embodiments described with respect to FIGS. 1 to 8 in that a substrate SUB_3 in a display device 10_3 includes no island ISL or no bridge BR, and that a dam structure DAM_3, a spacer SPC and a recess pattern RC may be arranged at a corner section CS of the display device 10_3.

For example, the display device 10_3 may include a display area DPA and a non-display area NDA. The display area DPA may include pixels and/or emission areas. The display area DPA may include a front surface FS, side surfaces SS: SS1, SS2, SS3 and SS4, and corner sections CS: CS1, CS2, CS3 and CS4.

The entire front surface FS may be substantially flat, but embodiments according to the present disclosure are not limited thereto. The side surfaces SS: SS1, SS2, SS3 and SS4 may be extended outward from the edges of the front surface FS to be bent at an angle (e.g., a set or predetermined angle). The first to fourth side surfaces SS1, SS2, SS3 and SS4 may be extended from the front surface FS to have a curvature (e.g., a set or predetermined curvature) and may have a round shape. The corner sections CS may be located between side surfaces SS: SS1, SS2, SS3 and SS4 adjacent to each other. Each of the first to fourth corner sections CS1, CS2, CS3 and CS4 may include a double curvature and may have a round shape.

Pixels may be located at the corner sections CS as well as the front surface FS and the side surfaces SS of the display device 10_3, and images can be displayed at the corner sections CS. Accordingly, when a user views the display device 10_3 from the front, the user can recognize that images are displayed on the entire areas of the display device 10_3. In other words, the user may recognize as if there is substantially no bezel and can experience more immersive contents.

The substrate SUB_3 may include a first pixel area PXA1, a second pixel area PXA2, and a non-pixel area LA. A plurality of pixels may be arranged on each of the first and second pixel areas PXA1 and PXA2, whereas no pixel may be arranged at the non-pixel area LA. Lines for driving the pixels may be located in the non-pixel area LA, but embodiments according to the present disclosure are not limited thereto. The first pixel area PXA1 and the second pixel area PXA2 may correspond to the display area DPA of the display device 10_3, and the non-pixel area LA may correspond to the non-display area NDA of the display device 10_3. The non-pixel area LA may be located on the outer side of the first pixel area PXA1 and the second pixel area PXA2 and may surround the first pixel area PXA1 and the second pixel area PXA2 in the expanded view.

The first pixel area PXA1 may include a main section MS and bending sections BS: BS1, BS2, BS3 and BS4. The main section MS may correspond to the front surface FS of the display device 10_3, and the bending sections BS: BS1, BS2, BS3 and BS4 may correspond to the side surfaces SS of the display device 10_3. The shape of the main section MS may substantially conform to the front surface FS of the display device 10_3, and the shapes of the bending sections BS: BS1, BS2, BS3 and BS4 may be substantially conform to the side surfaces SS of the display device 10_3.

The second pixel area PXA2 may be located between the bending sections BS: BS1, BS2, BS3 and BS4 adjacent to each other. In other words, the first to fourth bending sections BS1, BS2, BS3 and BS4 may be spaced apart from each other by at a distance (e.g., a set or predetermined distance) at at least some locations. The second pixel areas PXA2 may be located in the locations where the first to fourth bending sections BS1, BS2, BS3 and BS4 are spaced apart from one another. The shape of the second pixel areas PXA2 may conform to the shape of the corner sections CS of the display device 10_3.

The substrate SUB_3 may further include a plurality of protruding patterns CP. The protruding patterns CP adjacent to each other may be physically separated and spaced apart from one another in at least some areas. As will be described in more detail later, the protruding patterns CP may be physically separated from the uppermost layer to the lowermost layer, i.e., the substrate SUB (see FIG. 8) at at least some regions. A corner groove CG (or corner cutout pattern) may be located between the adjacent protruding patterns CP physically separated from each other. That is to say, there may be space between the protruding patterns CP adjacent to each other by the corner groove CG. Accordingly, even though the second pixel areas PXA2 have a double curvature, the protruding patterns CP of the second pixel areas PXA2 can be expanded and contracted, so that it is possible to reduce strain applied to the second pixel areas by virtue of the corner grooves CG. The protruding patterns CP may be formed by cutting the substrate SUB (see FIG. 8) with a laser, but embodiments according to the present disclosure are not limited thereto.

The protrusion patterns CP may protrude from the first pixel area PXA1. In other words, the protrusion patterns CP may protrude toward the outside of the first pixel area PXA1 from at least one of the main section MS or the bending sections BS of the first pixel area PXA1. One end of each of the protrusion patterns CP may be connected to the first pixel area PXA1. The non-pixel area LA may be located on the opposite side of the protrusion patterns CP connected to each first pixel area PXA1.

The second pixel area PXA2 may be located in the protruding pattern CP between the first pixel area PXA1 and the non-pixel area LA. The non-pixel area LA may be provided for each protruding pattern CP, and the non-pixel area LA provided for each protruding pattern CP may be separated and spaced apart from one another in the expanded view.

In the expanded view, the protruding patterns CP may be exposed except the parts connected to the first pixel area PXA1. The protrusion patterns CP may have different lengths in a direction in which they protrude from the first pixel area PXA1.

The plurality of protruding patterns CP may face each other. In other words, the plurality of protrusion patterns CP may be spaced apart from one another with the corner groove CG therebetween, and side surfaces of the protrusion patterns CP may face each other. The plurality of protrusion patterns CP may be separated by the corner grooves CG.

When the protrusion patterns CP are bent, the gap between the protrusion patterns CP adjacent to each other may be reduced, or the protrusion patterns CP adjacent to each other may be in direct contact with each other. When the protrusion patterns CP adjacent to each other are in direct contact with each other, a physical interface (or boundary) may be located between the protrusion patterns CP adjacent to each other. It is, however, to be understood that embodiments according to the present disclosure are not limited thereto. When the protrusion patterns CP are bent, the protrusion patterns CP adjacent to each other may overlap each other.

The dam structure DAM_3, the spacer SPC and the recess pattern RC may be located on the protrusion patterns CP. In addition, a plurality of first pixels PX1, a plurality of second pixels PX2 and a plurality of third pixels PX3 may be located on the protrusion patterns CP.

The dam structure DAM_3 may be arranged along the edges of the protrude pattern CP. Although the dam structure DAM_3 is arranged in the second pixel area PXA2 in the drawings, embodiments according to the present disclosure are not limited thereto. A part of the dam structure DAM_3 may be located in the non-pixel area LA of each protrusion pattern CP. The spacer SPC and the recess pattern RC may be arranged on each protrusion pattern CP and may be located in an area surrounded by the dam structure DAM_3. At least one spacer SPC and at least one recess pattern RC may be located in each protrusion pattern CP. For example, the spacer SPC and the recess pattern RC may be located between the second pixel PX2 and the third pixel PX3, but the numbers of the spacers SPC and the recess patterns RC are not particularly limited herein. The upper surface of the spacer SPC may be located at a higher position than the upper surface of the dam structure DAM_3 from one or the opposite surface of the substrate SUB_3.

Also in this instance, because the upper surface of the spacer SPC is located at a position higher than the upper surface of the dam structure DAM_3 from the one or the opposite surface of the substrate SUB_3 in the second pixel area PXA2 of the display device 10_3. Accordingly, it may be possible to prevent or reduce defects such as dents on the dam structure DAM (see FIG. 8). In addition, a variety of structures and designs may be applied to the display device 10_3.

In concluding the detailed description, those skilled in the art will appreciate that many variations and modifications can be made to the disclosed example embodiments without substantially departing from the principles of the present disclosure. Therefore, the disclosed embodiments of the invention are used in a generic and descriptive sense only and not for purposes of limitation.

What is claimed is:

1. A display device comprising:

a substrate comprising a display area and a non-display area surrounding the display area;

a first pixel on the substrate in the display area;

a dam structure on the substrate, surrounding the first pixel in a plan view and disposed in the display area;

a spacer in an area surrounded by the dam structure in the plan view;

a first inorganic encapsulation layer on the dam structure and the spacer; and an organic encapsulation layer on the first inorganic encapsulation layer, wherein an upper surface of the spacer is at a higher position than a portion of an upper surface of the dam structure and a portion of an upper surface of the organic encapsulation layer, the portion of the upper surface of the organic encapsulation layer being a surface of the organic encapsulation layer furthest from an upper surface of the substrate and disposed in the display area, and the portion of the upper surface of the dam structure being a surface of the dam structure furthest from the upper surface of the substrate, wherein a height measured from the upper surface of the substrate to the portion of the upper surface of the dam structure along a thickness direction perpendicular to the upper surface of the substrate is equal to or greater than a height measured from the upper surface of the substrate to the portion of the upper surface of the organic encapsulation layer along the thickness direction, wherein a first portion of the first inorganic encapsulation layer overlaps the upper surface of the dam structure in the thickness direction, and wherein a second portion of the first inorganic encapsulation layer overlaps the upper surface of the spacer in the thickness direction.

2. The display device of claim 1, wherein the spacer protrudes above the organic encapsulation layer.

3. The display device of claim 2, further comprising:

a second inorganic encapsulation layer on the organic encapsulation layer, wherein the first inorganic encapsulation layer on the spacer protruding above the organic encapsulation layer is in direct contact with the second inorganic encapsulation layer.

4. The display device of claim 1, further comprising:

a planarization layer on the substrate;

a passivation layer on the planarization layer; and a recess pattern defined by removing portions of the passivation layer and the planarization layer, wherein the recess pattern surrounds the spacer in the plan view.

5. The display device of claim 4, wherein a sidewall of the recess pattern comprises a side surface of the passivation layer and a side surface of the planarization layer, and wherein the side surface of the passivation layer protrudes outward from the side surface of the planarization layer.

6. The display device of claim 1, wherein a surface roughness of the upper surface of the spacer is greater than a surface roughness of the upper surface of the dam structure.

7. The display device of claim 1, wherein the organic encapsulation layer is in the area surrounded by the dam structure in the plan view.

8. The display device of claim 1, wherein the substrate further comprises a plurality of islands separated by slits, and a plurality of bridges connecting between adjacent ones of the islands, and wherein the first pixel and the dam structure are in each of the plurality of islands.

9. The display device of claim 8, wherein the spacer is in at least some of the plurality of islands.

10. The display device of claim 8, further comprising:

a second pixel in each of the plurality of islands, wherein the spacer is between the first pixel and the second pixel in the plan view.

11. The display device of claim 10, wherein the first pixel is configured to emit light of a first color, and the second pixel is configured to emit light of a second color different from the first color.

12. The display device of claim 8, wherein arrangement patterns of the plurality of islands and the plurality of bridges have arrangement pattern units, and wherein the arrangement pattern units are repeatedly arranged along a first direction and a second direction crossing the first direction.

13. The display device of claim 12, wherein the arrangement pattern units comprise a first arrangement pattern unit and a second arrangement pattern unit adjacent to the first arrangement pattern unit along the first direction or the second direction, and wherein the second arrangement pattern unit has a line-symmetric shape with respect to the first arrangement pattern unit.

* * * * *